(12) United States Patent
Tezuka et al.

(10) Patent No.: US 11,227,915 B2
(45) Date of Patent: Jan. 18, 2022

(54) SEMICONDUCTOR DEVICE

(71) Applicant: KIOXIA CORPORATION, Tokyo (JP)

(72) Inventors: Ryuta Tezuka, Yokohama Kanagawa (JP); Mitsuhiro Noguchi, Yokohama Kanagawa (JP); Tomoaki Shino, Kamakura Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/996,491

(22) Filed: Aug. 18, 2020

(65) Prior Publication Data

US 2021/0305368 A1  Sep. 30, 2021

(30) Foreign Application Priority Data

Mar. 24, 2020 (JP) .............................. JP2020-053410

(51) Int. Cl.
*H01L 29/06* (2006.01)
*H01L 23/00* (2006.01)
*H01L 25/18* (2006.01)

(52) U.S. Cl.
CPC .......... *H01L 29/0684* (2013.01); *H01L 24/05* (2013.01); *H01L 24/45* (2013.01); *H01L 25/18* (2013.01); *H01L 29/0649* (2013.01); *H01L 2224/04042* (2013.01); *H01L 2924/1434* (2013.01)

(58) Field of Classification Search
CPC . H01L 29/0684; H01L 29/0649; H01L 24/45; H01L 24/05; H01L 25/18; H01L 2224/04042; H01L 2924/1434

USPC .......... 257/777, 50, 532, 534, 307, E21.011, 257/E21.012; 438/253, 131
See application file for complete search history.

(56) References Cited

U.S. PATENT DOCUMENTS

| | | | |
|---|---|---|---|
| 4,470,060 A * | 9/1984 | Yamazaki | ......... H01L 29/78642 349/46 |
| 6,963,122 B1 * | 11/2005 | Soenen | ............... H01L 23/5223 257/532 |
| 8,049,267 B2 | 11/2011 | Sugimae et al. | |
| 8,994,145 B2 | 3/2015 | Sato | |
| 10,811,415 B2 * | 10/2020 | Sengupta | ............ H01L 27/0924 |

(Continued)

FOREIGN PATENT DOCUMENTS

JP       2012038756 A      2/2012

*Primary Examiner* — Dao H Nguyen
(74) *Attorney, Agent, or Firm* — Kim & Stewart LLP

(57) ABSTRACT

According to one embodiment, a semiconductor device includes a first semiconductor layer on a semiconductor substrate and a second semiconductor layer on the first semiconductor layer. The first semiconductor layer is between the second semiconductor layer and the semiconductor substrate in a first direction. A first conductive layer is on the second semiconductor layer and contacting the second semiconductor layer. A third semiconductor layer is spaced from the second semiconductor layer in a second direction and connected to the first semiconductor layer. A second conductive layer is spaced from the first conductive layer in the second direction and connected to the third semiconductor layer. Each of the first semiconductor layer, the second semiconductor layer, and the third semiconductor layer extends lengthwise in a third direction intersecting the first direction and the second direction.

20 Claims, 29 Drawing Sheets

(56) References Cited

U.S. PATENT DOCUMENTS

| | | | |
|---|---|---|---|
| 2011/0278586 A1* | 11/2011 | Ando | H01L 29/0649 |
| | | | 257/76 |
| 2015/0060971 A1 | 3/2015 | Fujii | |
| 2017/0358671 A1* | 12/2017 | Lin | H01L 29/1075 |
| 2020/0119147 A1* | 4/2020 | Kinoshita | H01L 21/02529 |
| 2021/0249350 A1* | 8/2021 | Shen | H01L 21/76804 |

* cited by examiner

SEMICONDUCTOR DEVICE

CROSS-REFERENCE TO RELATED APPLICATION(S)

This application is based upon and claims the benefit of priority from Japanese Patent Application No. 2020-053410, filed Mar. 24, 2020, the entire contents of which are incorporated herein by reference.

FIELD

Embodiments described herein relate generally to a semiconductor device.

BACKGROUND

A semiconductor device including a capacitor formed of a semiconductor substrate, a first semiconductor layer on the semiconductor substrate, and a second semiconductor layer on the first semiconductor layer is known.

DETAILED DESCRIPTION

Figure 1:
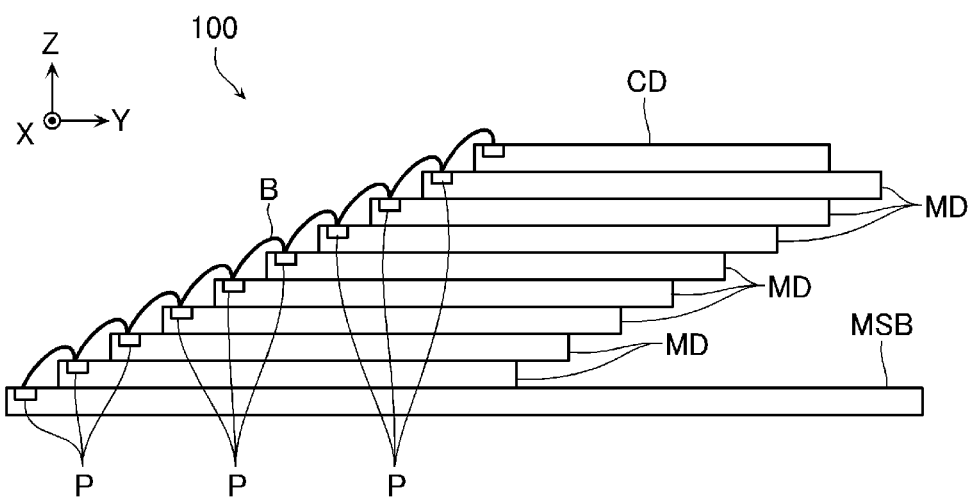
FIG. 1 is a schematic side view a memory system according to a first embodiment.

Embodiments provide a semiconductor device that operates at a high speed.

In general, according to one embodiment, a semiconductor device includes a first semiconductor layer on a semiconductor substrate and a second semiconductor layer on the first semiconductor layer. The first semiconductor layer is between the second semiconductor layer and the semiconductor substrate in a first direction. A first conductive layer is on the second semiconductor layer and contacting the second semiconductor layer. A third semiconductor layer is spaced from the second semiconductor layer in a second direction and connected to the first semiconductor layer. A second conductive layer is spaced from the first conductive layer in the second direction intersecting the first direction. The second conductive layer is connected to the third semiconductor layer. Each of the first semiconductor layer, the second semiconductor layer, and the third semiconductor layer extends lengthwise in a third direction intersecting the first direction and the second direction.

Next, a semiconductor device according to various example embodiments will be described with reference to drawings. The following embodiments are merely examples, and are not intended to limit the disclosure.

In the specification, one direction parallel to a surface of a semiconductor substrate is referred to as an X direction, another direction parallel to the surface of the semiconductor substrate and perpendicular to the X direction is referred to as a Y direction, and a direction orthogonal to the surface of the semiconductor substrate is referred to as a Z direction.

In the specification, a direction along a particular plane may be referred to as a first direction, a direction intersecting the first direction along the plane may be referred to as a second direction, and a direction intersecting the plane may be referred to as a third direction. Anyone of the first direction, the second direction, and the third direction may or may not correspond to any one of the X direction, the Y direction, and the Z direction.

In the specification, expressions such as "upper" and "lower" are generally taking the semiconductor substrate as a reference. For example, a direction going further away from the semiconductor substrate along the Z direction is referred to as an upward or upper direction, and a direction approaching the semiconductor substrate along the Z direction is referred to as lower or lower direction. When referring to a lower surface or a lower end part of an element, component, or other structural aspect, it means a surface or an end part on a semiconductor substrate side of the element, component, or other structural aspect, and when referring to an upper surface or an upper end part, it means a surface or an end part on a side opposite to the semiconductor substrate. A surface intersecting the plane of X direction and the Y direction is referred to as a side surface or the like.

In the present specification, when a first element is referred to as being "electrically connected" to a second element, the first element may be directly connected to the second element, or the first element may be connected to the second element via a wiring, a semiconductor member, a transistor or the like. For example, when three transistors are connected in series, a first transistor in the series may still be referred to as "electrically connected" to a third transistor in the series even when a second transistor in the series is in an OFF state.

In the present specification, when the first element is said to be "connected between" the second element and the third element, it may mean that the first element, the second element, and the third element are connected in series, and the first element is provided in a current path between the second element and the third element.

In the present specification, when a circuit is said to "electrically conduct" between two wirings, it may mean for example, that the circuit includes a transistor, the transistor is provided in a current path between the two wirings, and the transistor is in an ON state.

Furthermore, in the present specification, in some instances, portions of the same initial layer which get divided into separate portions, may each be referred to as a layer or a portion thereof depending on context.

First Embodiment

Figure 2:
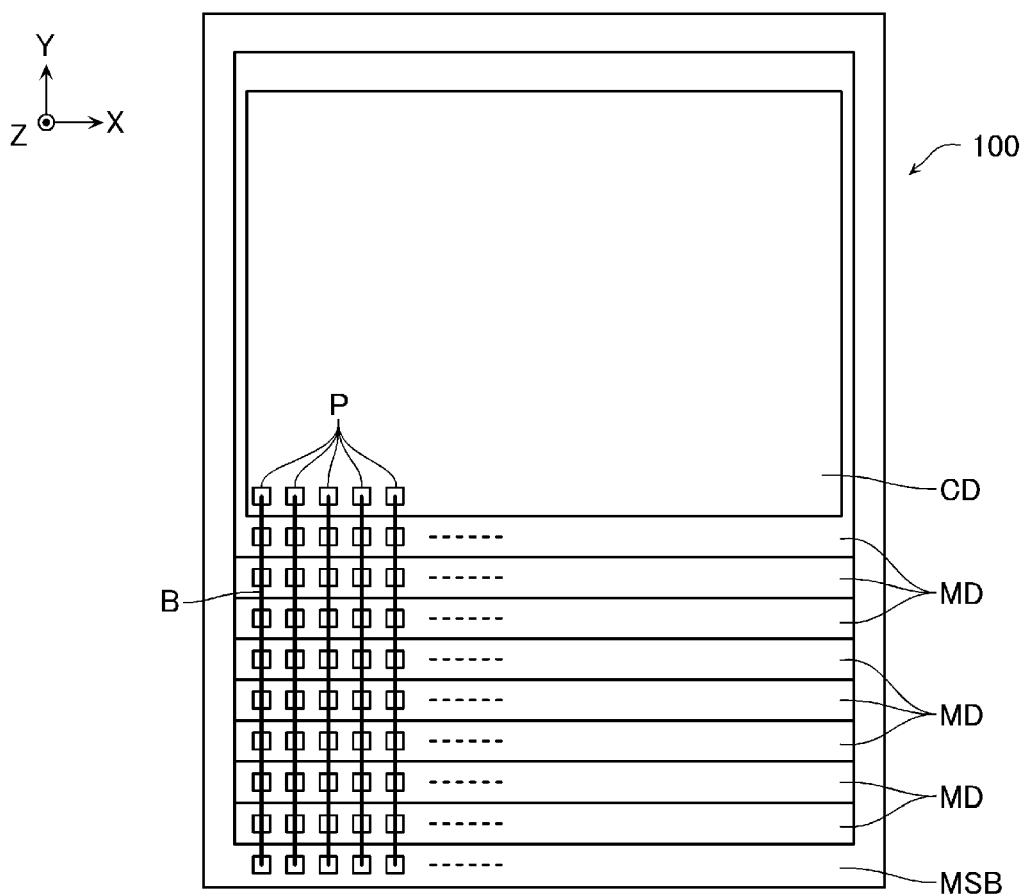
FIG. 2 is a schematic plan view of the memory system according to a first embodiment.

FIG. 1 is a schematic side view showing a configuration example of a memory system 100 according to a first embodiment. FIG. 2 is a schematic plan view showing a configuration example of the memory system 100. For convenience of explanation, some parts of the configuration are omitted in FIGS. 1 and 2.

As shown in FIG. 1, the memory system 100 according to the first embodiment includes a mounting substrate MSB, a plurality of memory dies MD stacked on the mounting substrate MSB, and a control die CD stacked on the memory dies MD. Bonding pad electrodes P are provided in a region of an end part in the Y direction on an upper surface of the mounting substrate MSB, and a region of another part of the upper surface is connected to a lower surface of the memory dies MD via an adhesive or the like. Bonding pad electrodes P are provided in a region of an end part in the Y direction on an upper surface of each memory die MD, and a region of another part of the upper surface is connected to a lower surface of another memory die MD or the control die CD via an adhesive or the like. Bonding pad electrodes P are provided in a region of an end part in the Y direction on an upper surface of the control die CD.

As shown in FIG. 2, each of the mounting substrate MSB, the plurality of memory dies MD, and the control die CD includes a plurality of bonding pad electrodes P. The bonding pad electrodes P provided on the mounting substrate MSB, the memory dies MD, and the control die CD are connected via bonding wires B.

Figure 3:
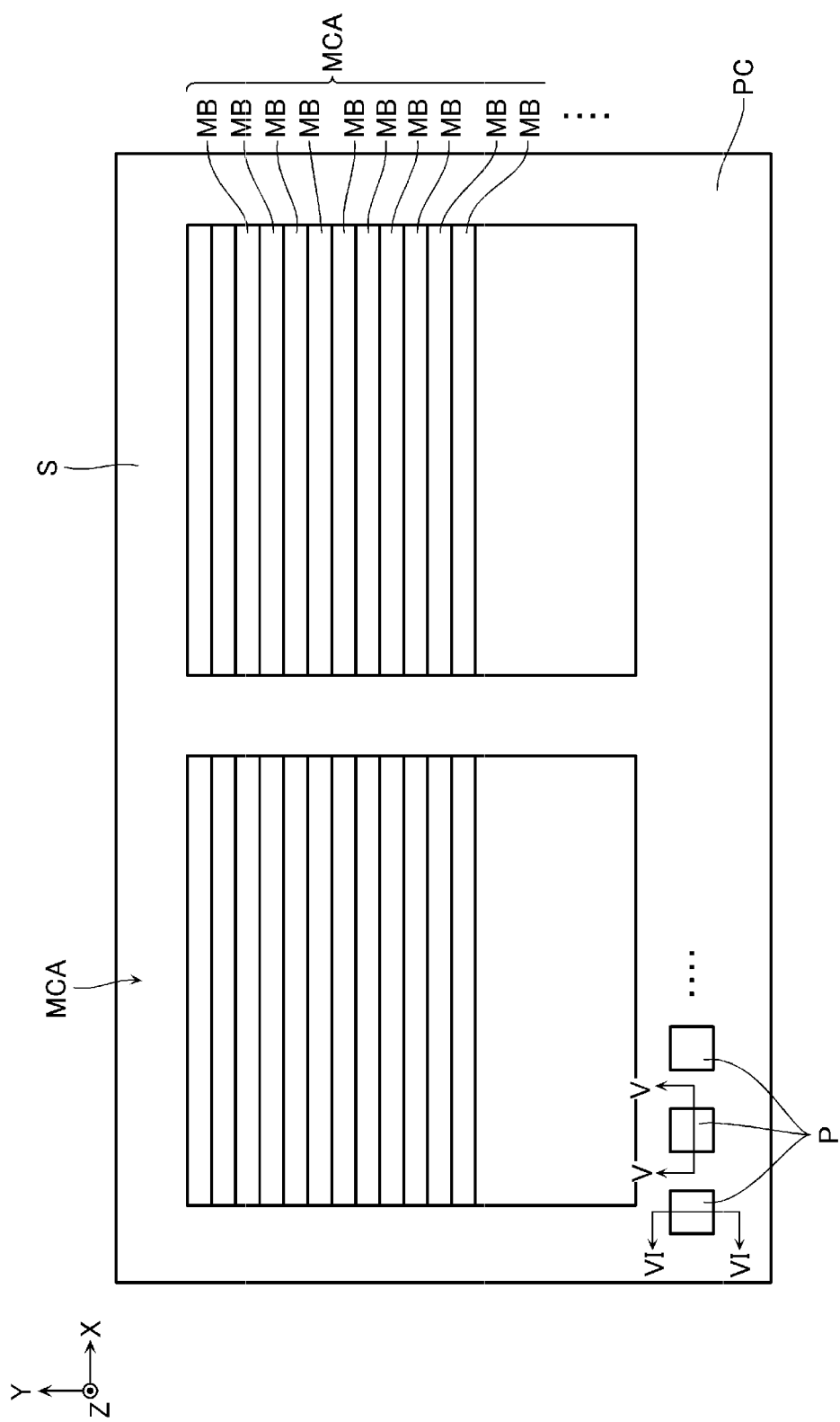
FIG. 3 is a schematic plan view showing a configuration of a memory die.

FIG. 3 is a schematic plan view showing a configuration of each memory die MD. In the example of FIG. 3, the memory die MD includes a semiconductor substrate S, memory cell arrays MCA provided on an upper surface of the semiconductor substrate S, and a peripheral circuit PC provided in a periphery of the memory cell arrays MCA. In the example of FIG. 3, two memory cell arrays MCA arranged in the X direction are provided on the upper surface of the semiconductor substrate S. Each memory cell array MCA includes a plurality of memory blocks MB arranged in the Y direction. The bonding pad electrodes P are provided in a part of the peripheral circuit PC.

Figure 4:
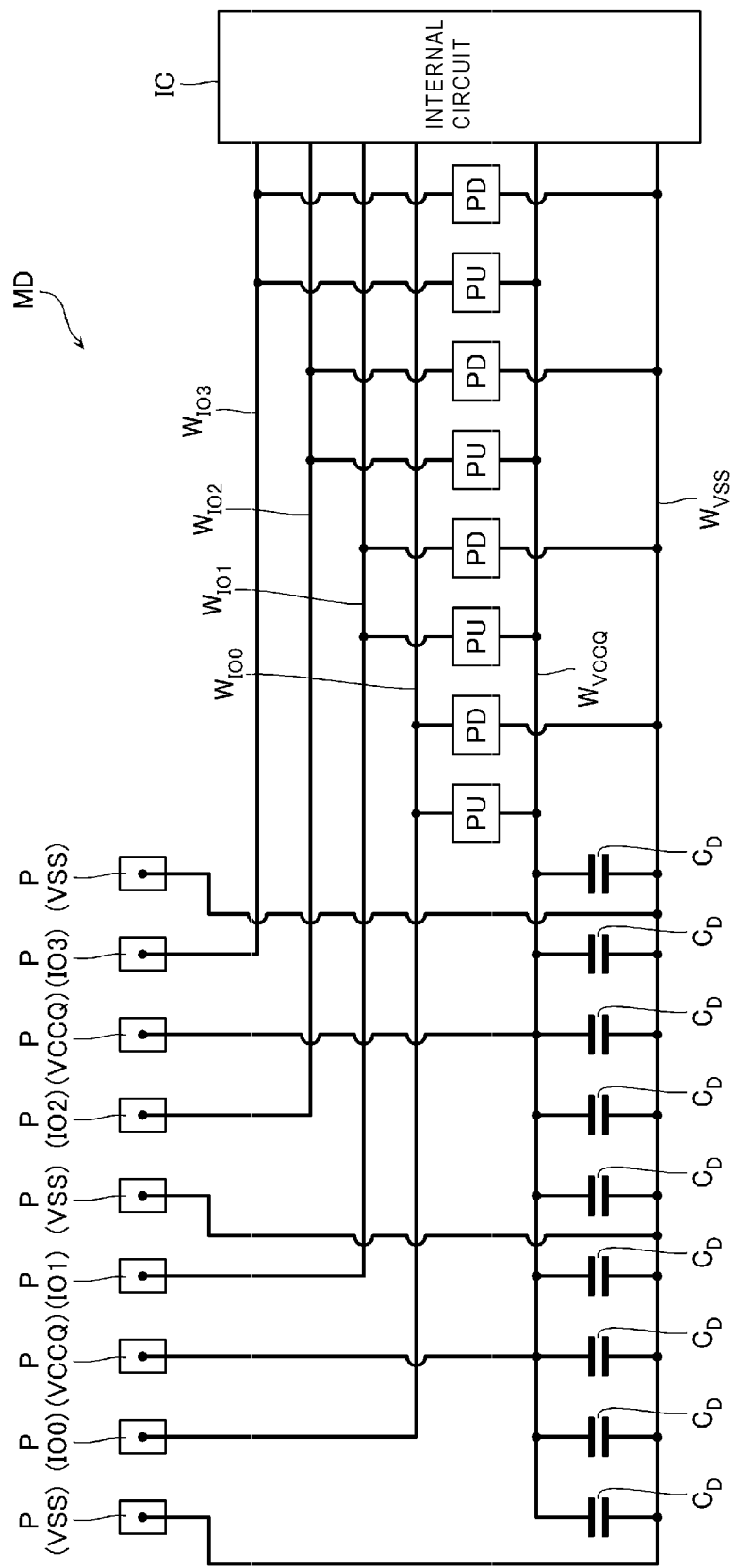
FIG. 4 is a schematic circuit diagram of a memory die.

FIG. 4 is a schematic circuit diagram showing a configuration of a part of the memory die MD. As shown in FIG. 4, the memory die MD includes bonding pad electrodes P, decoupling capacitors $C_D$ (note capacitors $C_D$ are distinct from control dies CD in this context) connected to the bonding pad electrodes P, and an internal circuit IC connected to the bonding pad electrodes P.

Some of the bonding pad electrodes P are connected to input and output signal lines $W_{IO0}$, $W_{IO1}$, $W_{IO2}$, $W_{IO3}$ ... that transfer input signals and output signals. The plurality of input and output signal lines $W_{IO0}$, $W_{IO1}$, $W_{IO2}$, $W_{IO3}$ ... are connected to a comparator or the like in the internal circuit IC.

Some of the bonding pad electrodes P are connected to a voltage transfer line $W_{VSS}$ that supplies a ground voltage VSS to each element in the memory die MD. The voltage transfer line $W_{VSS}$ is connected to the internal circuit IC. A pull-down circuit PD is connected between the voltage transfer line $W_{VSS}$ and each of the input and output signal lines $W_{IO0}$, $W_{IO1}$, $W_{IO2}$, $W_{IO3}$ .... Each pull-down circuit PD includes a plurality of NMOS transistors connected in parallel with each other between the voltage transfer line $W_{VSS}$ and each of the input and output signal lines $W_{IO0}$, $W_{IO1}$, $W_{IO2}$, $W_{IO3}$ ....

Some of the bonding pad electrodes P are connected to a voltage transfer line $W_{VCCQ}$ that supplies a drive voltage VCCQ to each element in the memory die MD. The voltage transfer line $W_{VCCQ}$ is connected to the internal circuit IC. A pull-up circuit PU is connected between the voltage transfer line $W_{VCCQ}$ and each of the input and output signal lines $W_{IO0}$, $W_{IO1}$, $W_{IO2}$, $W_{IO3}$ .... Each pull-up circuit PU includes a plurality of PMOS transistors connected in parallel with each other between the voltage transfer line $W_{VCCQ}$ and each of the input and output signal lines $W_{IO0}$, $W_{IO1}$, $W_{IO2}$, $W_{IO3}$ ....

The plurality of decoupling capacitors $C_D$ are connected in parallel with each other between the voltage transfer line $W_{VSS}$ and the voltage transfer line $W_{VCCQ}$.

The internal circuit IC includes the memory cell arrays MCA and the peripheral circuit PC (described with reference to FIG. 3). The peripheral circuit PC drives the pull-down circuits PD or the pull-up circuits PU corresponding to the input and output signal lines $W_{IO0}$, $W_{IO1}$, $W_{IO2}$, $W_{IO3}$ ... at the time of outputting data. Accordingly, the input and output signal lines $W_{IO0}$, $W_{IO1}$, $W_{IO2}$, $W_{IO3}$ ... electrically conduct the voltage transfer line $W_{VSS}$ or the voltage transfer line $W_{VCCQ}$.

Next, a configuration example of the memory die MD will be described with reference to FIGS. 5 to 14.

Figure 5:
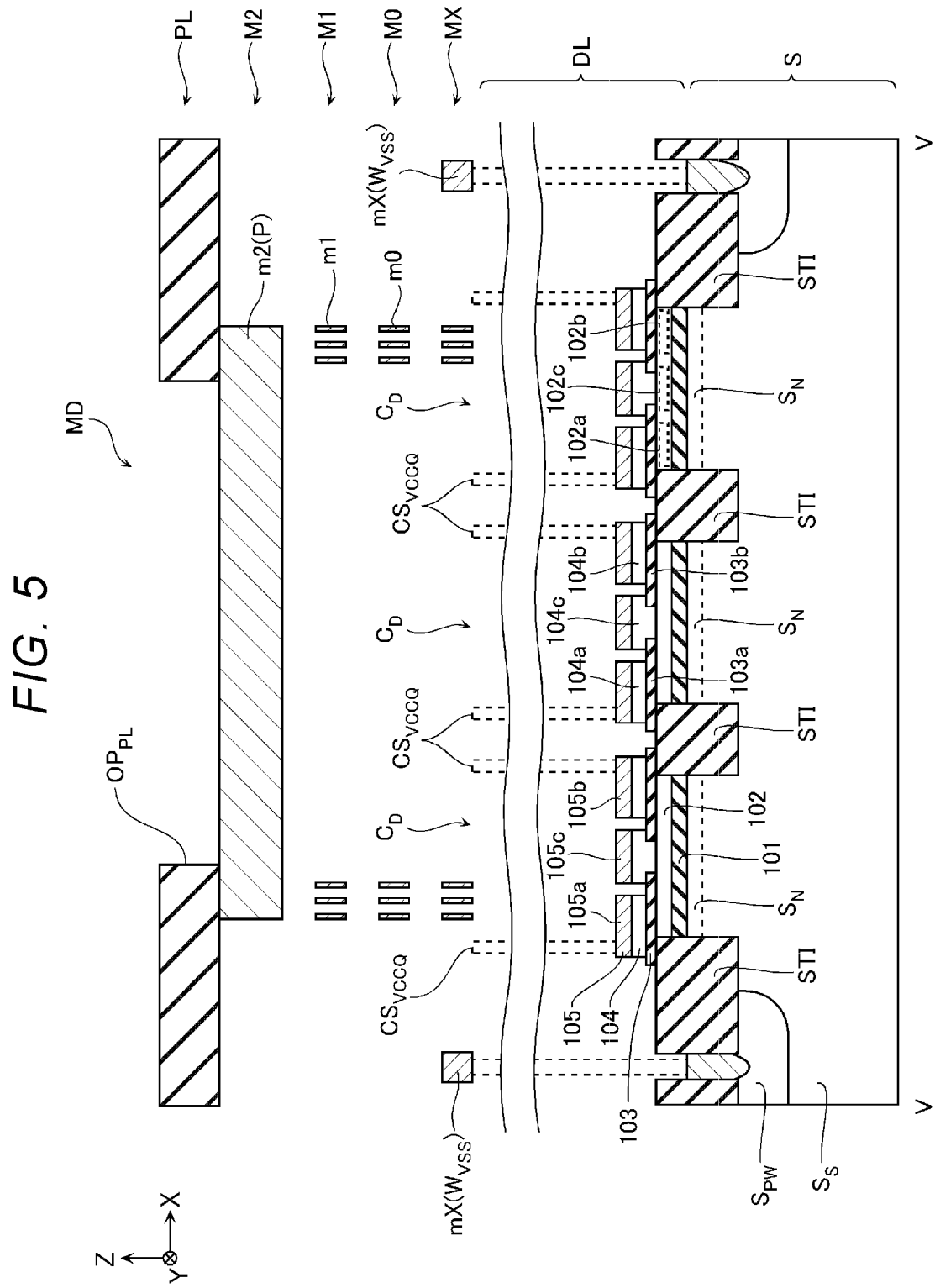
FIG. 5 is a schematic cross-sectional view obtained by cutting a structure shown in FIG. 3 along a line V-V.
Figure 6:
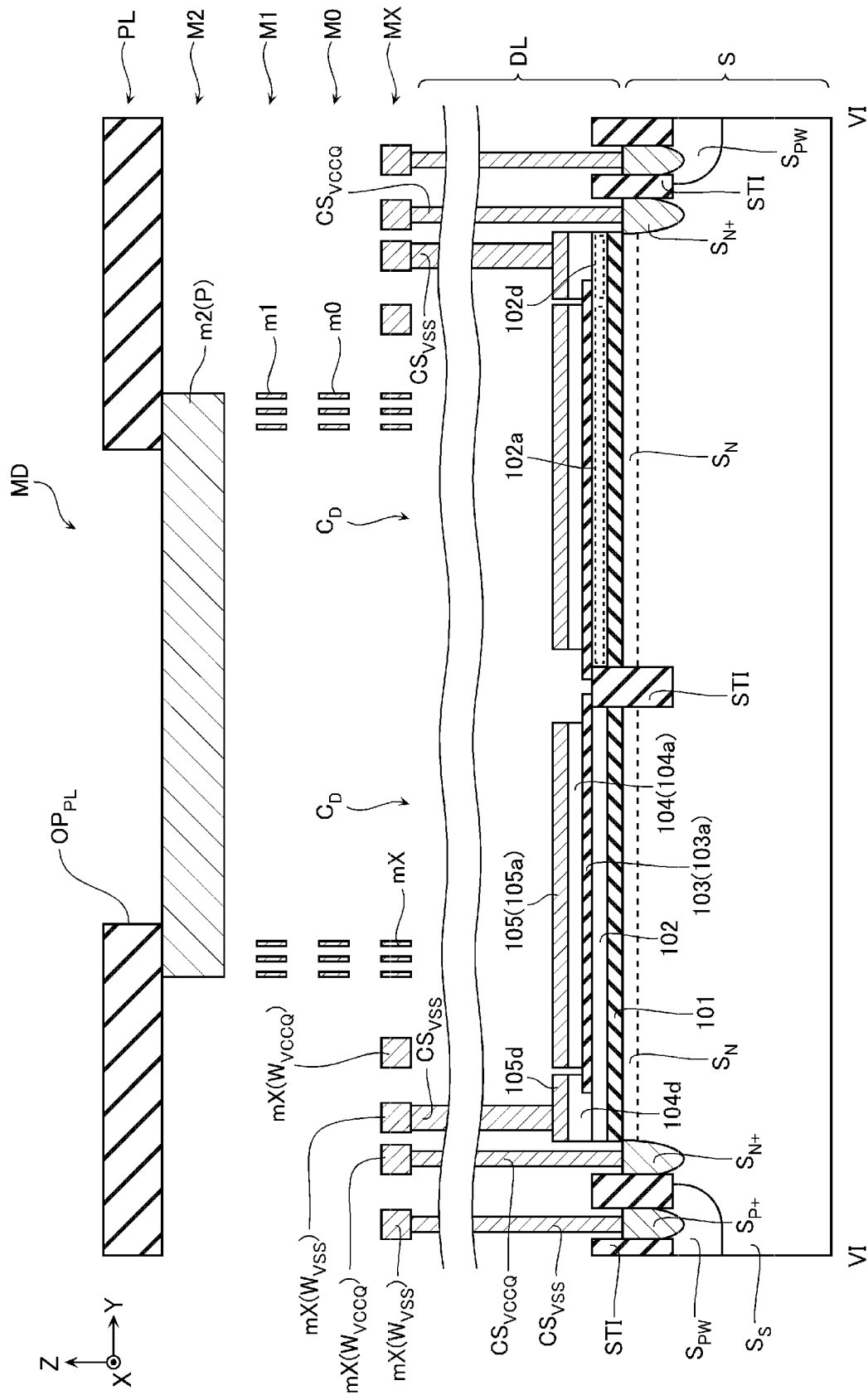
FIG. 6 is a schematic cross-sectional view obtained by cutting the structure shown in FIG. 3 along a line VI-VI.

FIG. 5 is a schematic cross-sectional view obtained by cutting a structure shown in FIG. 3 along a line V-V and viewed along a direction of an arrow. FIG. 6 is a schematic cross-sectional view obtained by cutting a structure shown in FIG. 3 along a line VI-VI and viewed along a direction of an arrow.

As shown in FIGS. 5 and 6, the memory die MD includes a passivation layer PL provided on the upper surface, a wiring layer M2 provided below the passivation layer PL, a wiring layer M1 provided below the wiring layer M2, a wiring layer M0 provided below the wiring layer M1, a wiring layer MX provided below the wiring layer M0, a device layer DL provided below the wiring layer MX, and the semiconductor substrate S provided below the device layer DL.

Figure 7:
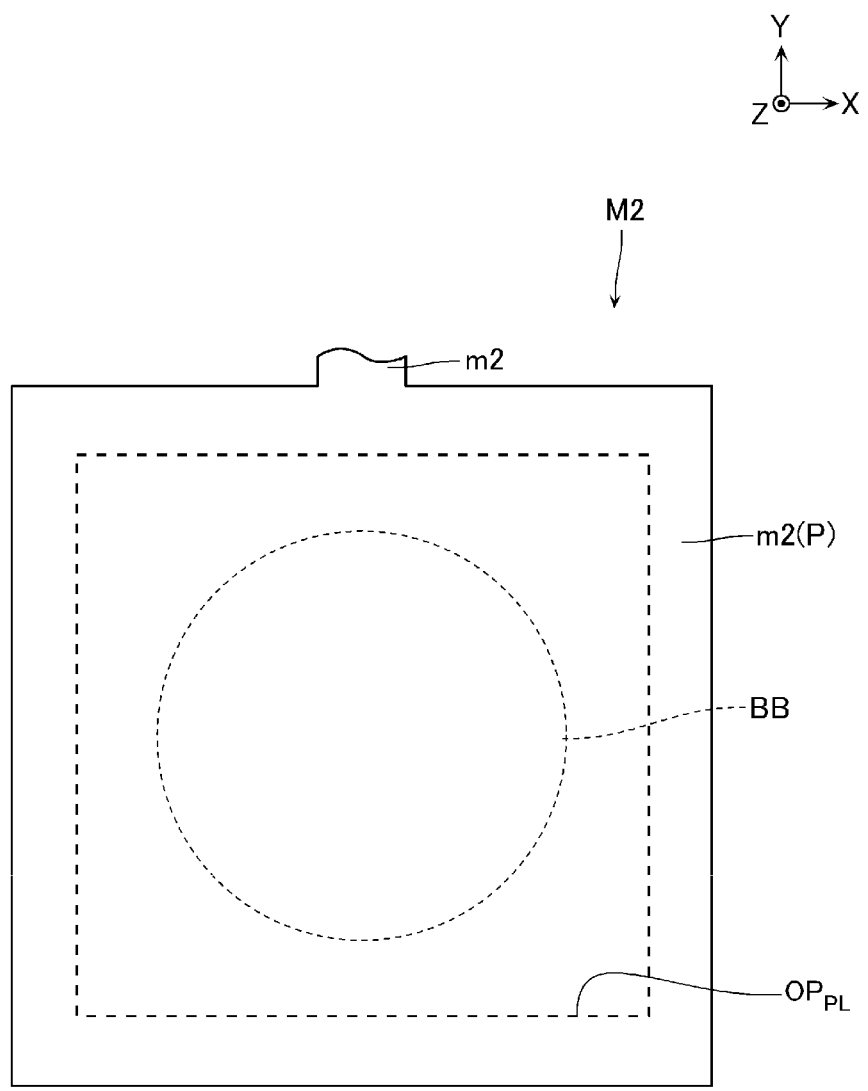
FIG. 7 is a schematic plan view showing a configuration of a wiring layer.

FIG. 7 is a schematic plan view showing a configuration of the wiring layer M2. The wiring layer M2 includes a plurality of wirings m2 containing, for example, titanium nitride (TiN) and aluminum (Al). Some of the wirings m2 function as the bonding pad electrodes P. Each bonding pad electrode P is formed in a substantially rectangular shape. As shown in FIGS. 5 and 6, apart of the upper surface of the bonding pad electrode P is covered with the passivation layer PL such as polyimide. As shown in FIGS. 5 and 6, a part of the upper surface of the bonding pad electrode P is exposed to an outside via an opening $OP_{PL}$ provided in the passivation layer PL. As shown in FIG. 7, a substantially circular bonding region BB that is in contact with the bonding wire B (FIGS. 1 and 2) is provided on the upper surface of the bonding pad electrode P.

Figure 8:
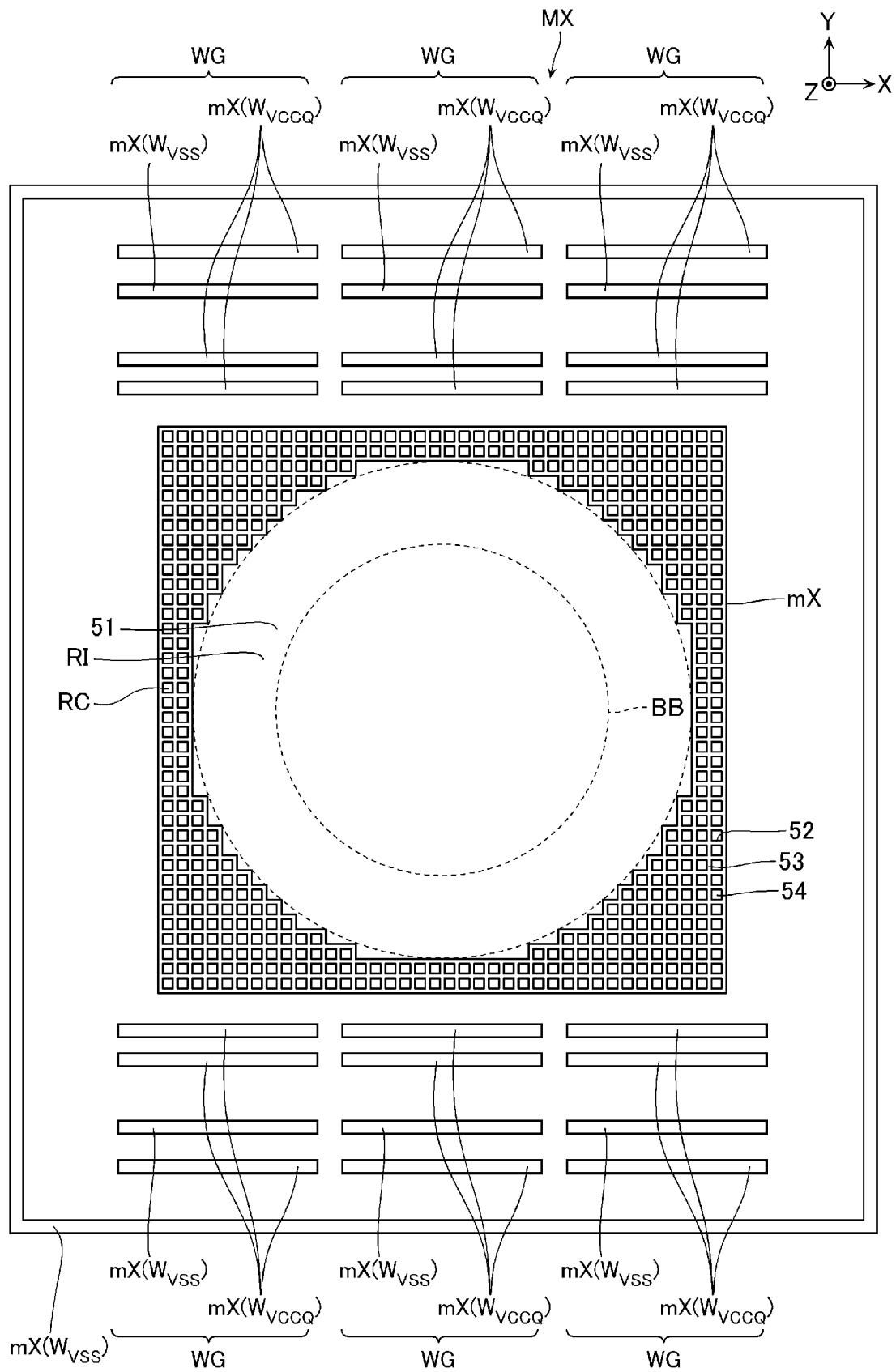
FIG. 8 is a schematic plan view showing a configuration of another wiring layer.

FIG. 8 is a schematic plan view showing a configuration of the wiring layer MX. The wiring layer MX includes a plurality of wirings mX containing, for example, titanium nitride (TiN) and tungsten (W).

A substantially circular insulating region RI and a substantially rectangular conductive region RC surrounding the substantially circular insulating region RI are provided in a region in the wiring layer MX overlapping the bonding pad electrode P when viewed from the Z direction. The insulating region RI is, for example, a region embedded with an insulating layer 51 such as silicon oxide ($SiO_2$) and does not include a conductive member or the like. The bonding region BB corresponding to a contact surface of the bonding pad electrode P and the bonding wire B is provided inside the insulating region RI. The conductive region RC includes, for example, a plurality of conductive members 52 extending in the X direction and arranged in the Y direction, and a plurality of conductive members 53 extending in the Y direction and arranged in the X direction. The conductive members 52 and 53 are a part of the plurality of wirings mX described above. An insulating layer 54 such as silicon oxide ($SiO_2$) is provided between the conductive members 52 and 53.

Six wiring groups WG arranged in the X direction and the Y direction are provided in a region in the wiring layer MX not overlapping the bonding pad electrode P when viewed from the Z direction. Each of the six wiring groups WG includes a plurality of wirings mX extending in the X direction and arranged in the Y direction. Each of the plurality of wirings mX functions as apart of the voltage transfer line $W_{VSS}$ or the voltage transfer line $W_{VCCQ}$ described above. A wiring mX is provided around the six wiring groups WG such that the wiring mX surrounds the six pairs of wiring groups WG and the conductive members 52 and 53. The wiring mX functions as a part of the voltage transfer line $W_{VSS}$.

Although detailed configuration is omitted, the wiring layer M0 (see FIGS. 5 and 6) includes a plurality of wirings m0 containing, for example, titanium nitride (TiN) and tungsten (W). The wiring layer M1 (see FIGS. 5 and 6) includes a plurality of wirings m1 containing, for example, titanium nitride (TiN) and copper (Cu). A substantially circular insulating region and a substantially rectangular conductive region surrounding the substantially circular insulating region (as described with reference to FIG. 8) are provided in regions overlapping the bonding pad electrodes P in the wiring layer M0 and the wiring layer M1 when viewed from the Z direction.

Figure 9:
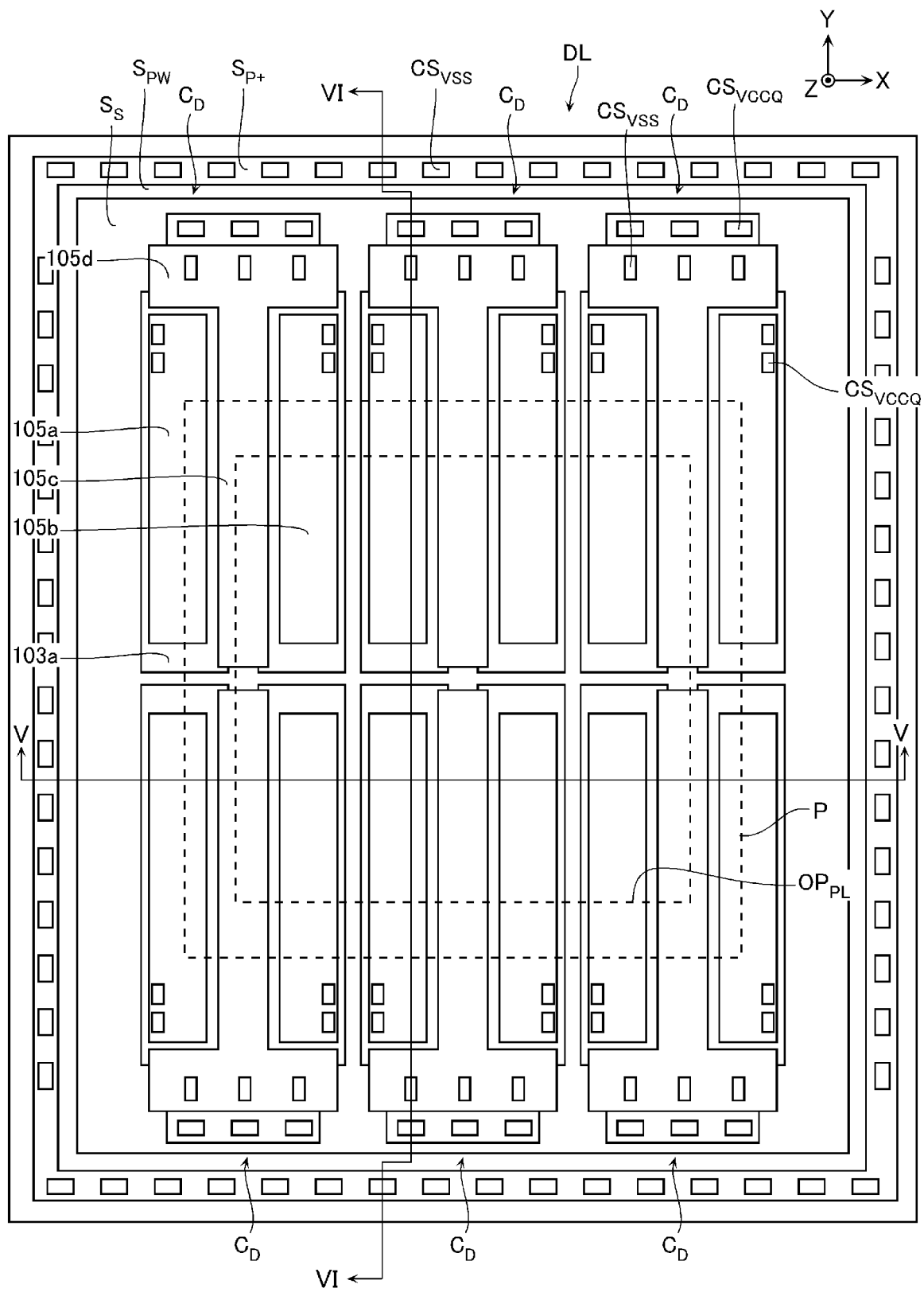
FIG. 9 is a schematic plan view showing a configuration of a device layer.

FIG. 9 is a schematic plan view showing a configuration of the device layer DL. A cross section obtained by cutting the structure shown in FIG. 9 along the line V-V and viewed in the direction of the arrow is schematically corresponding to the device layer DL in FIG. 5. A cross section obtained by cutting the structure shown in FIG. 9 along the line VI-VI and viewed in the direction of the arrow is schematically corresponding to the device layer DL in FIG. 6. The device layer DL is provided with some of the plurality of decoupling capacitors $C_D$. In the example of FIG. 9, six decoupling capacitors $C_D$ arranged in the X direction and the Y direction are provided corresponding to one bonding pad electrode P. The six decoupling capacitors $C_D$ extend from the region overlapping the bonding pad electrode P to the region not overlapping the bonding pad electrode P in the Y direction. A plurality of contact electrodes $CS_{VSS}$ and $CS_{VCCQ}$ that connect the wirings mX in the wiring groups WG and the decoupling capacitors $C_D$ are provided in a region corresponding to the wiring groups WG (FIG. 8). A plurality of contact electrodes $CS_{VSS}$ are provided around the six decoupling capacitors $C_D$ such that the contact electrodes $CS_{VSS}$ surround the six decoupling capacitors $C_D$.

Figure 10:
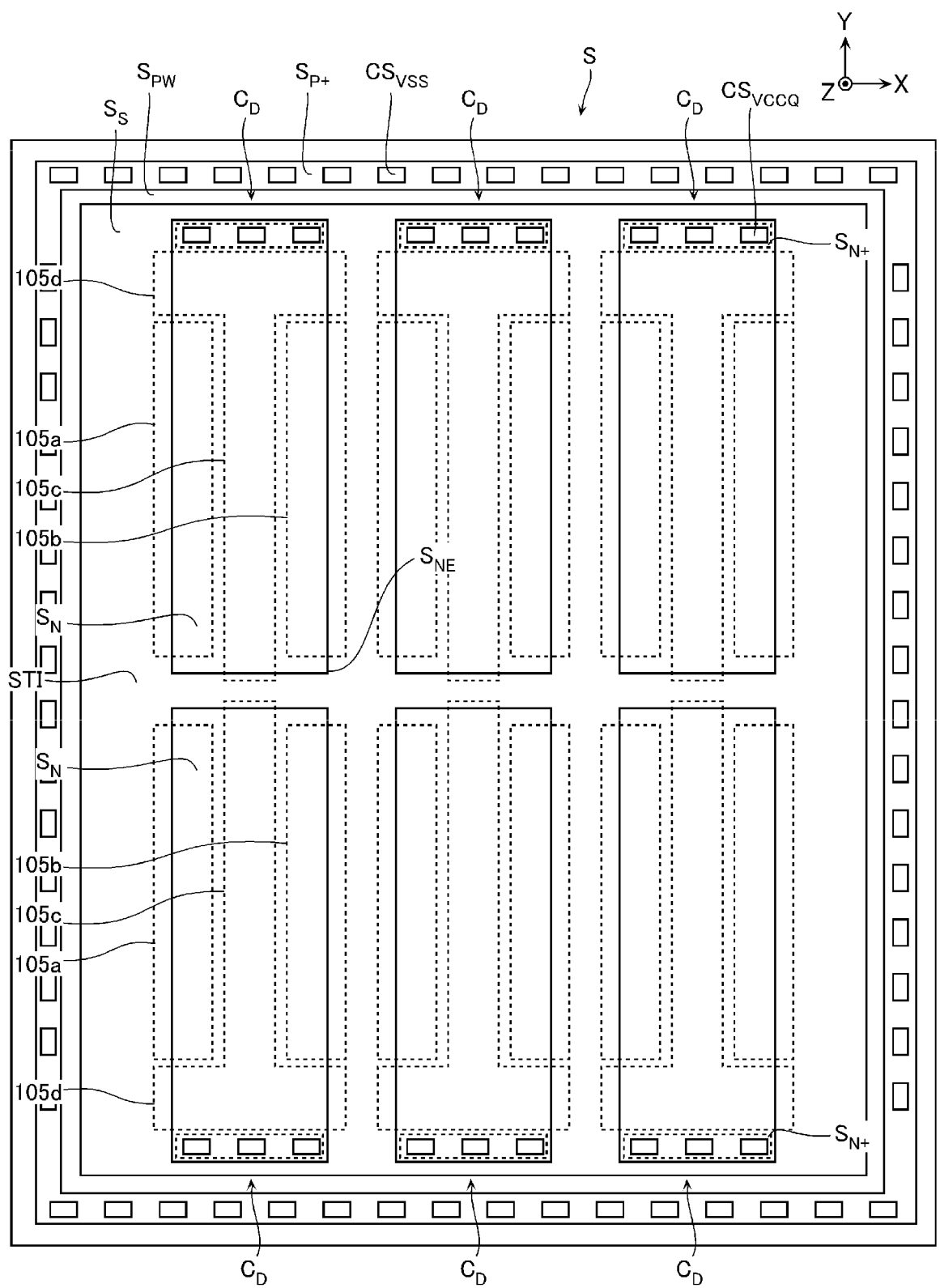
FIG. 10 is a schematic plan view showing a configuration of a semiconductor substrate.

FIG. 10 is a schematic plan view showing a configuration of the semiconductor substrate S. The semiconductor substrate S is, for example, a semiconductor substrate such as single crystal silicon containing a P-type impurity such as boron (B). The semiconductor substrate S is provided with a semiconductor substrate region $S_S$ and a P-well region $S_{PW}$ provided in a manner of surrounding the semiconductor substrate region $S_S$.

An impurity region $S_N$ is provided in a region corresponding to the decoupling capacitor $C_D$ in the semiconductor substrate region SS. The impurity region $S_N$ contains, for example, an N-type impurity such as phosphorus (P) or arsenic (As). An impurity region $S_{N+}$ is provided at one end of the impurity region $S_N$ in the Y direction. The impurity region $S_{N+}$ contains, for example, an N-type impurity such as phosphorus (P) or arsenic (As). An impurity concentration in the impurity region $S_{N+}$ is higher than an impurity concentration in the impurity region $S_N$.

The P-well region $S_{PW}$ contains, for example, a P-type impurity such as boron (B). An impurity concentration in the P-well region $S_{PW}$ is higher than an impurity concentration in the semiconductor substrate region $S_S$. An impurity region $S_{P+}$ is provided in a region corresponding to the plurality of contact electrodes $CS_{VSS}$ in the P-well region $S_{PW}$. The impurity region $S_{P+}$ includes, for example, a P-type impurity such as boron (B). An impurity concentration in the impurity region $S_{P+}$ is higher than the impurity concentration in the P-well region $S_{PW}$.

Figure 11:
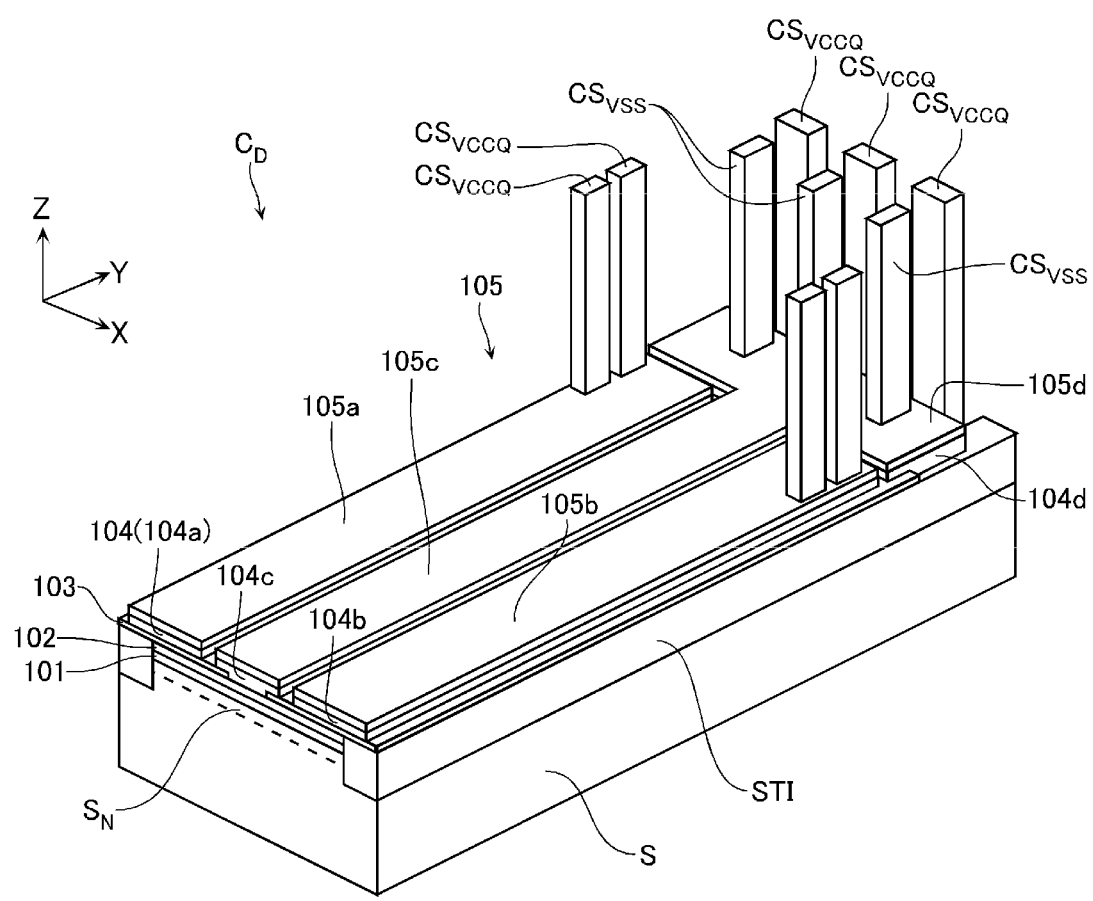
FIG. 11 is a schematic perspective view showing a configuration of a decoupling capacitor.
Figure 12:
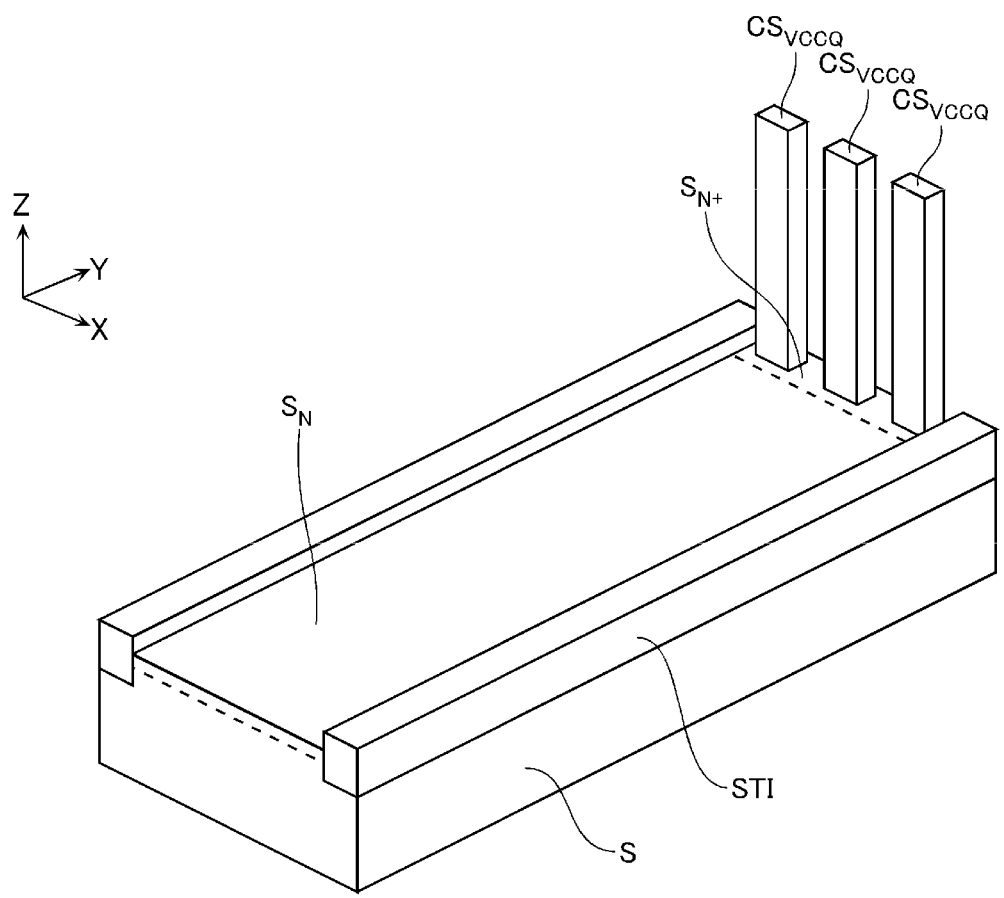
FIG. 12 is a schematic perspective view showing a configuration of a part of the decoupling capacitor.
Figure 13:
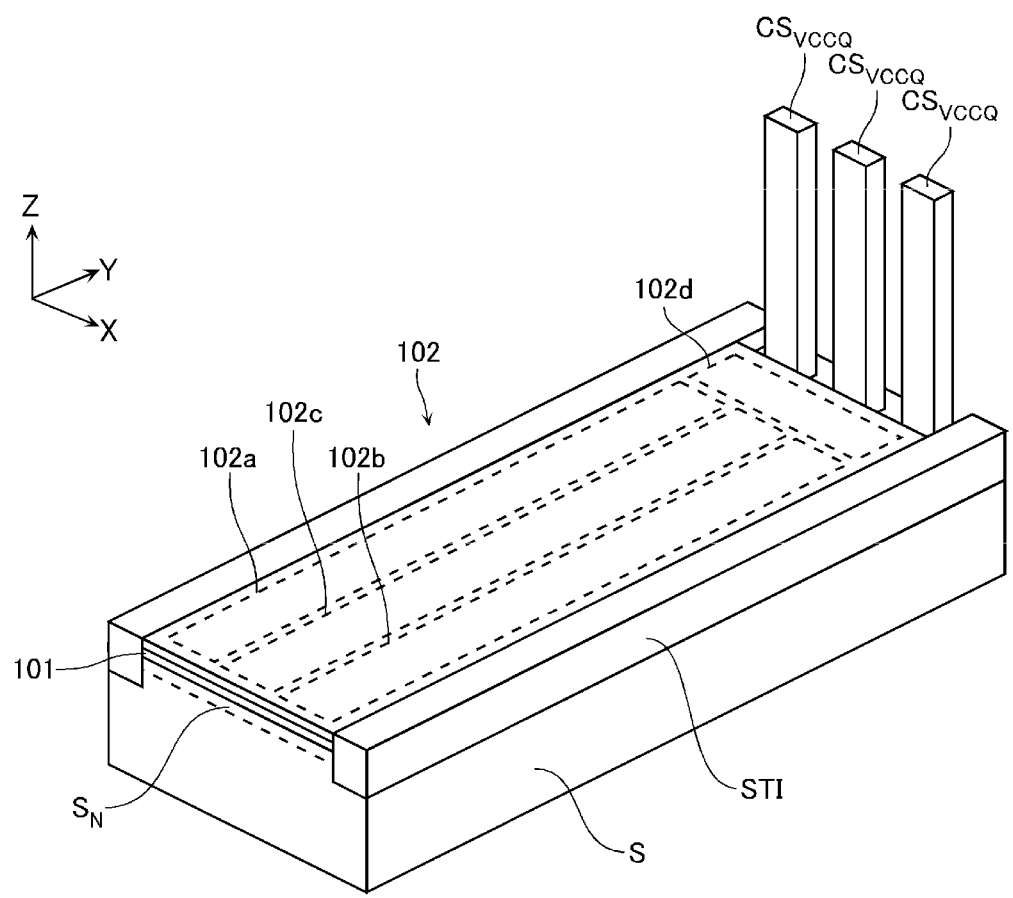
FIG. 13 is a schematic perspective view showing a configuration of a part of the decoupling capacitor.
Figure 14:
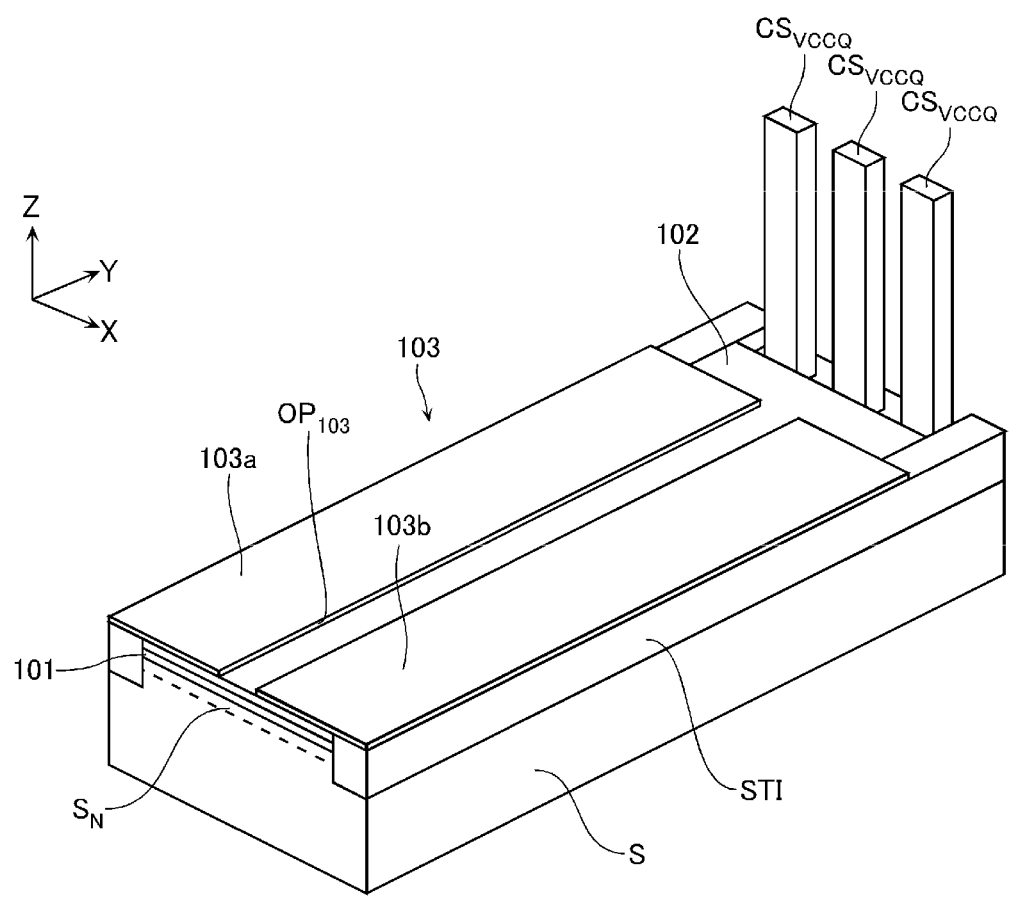
FIG. 14 is a schematic perspective view showing a configuration of a part of the decoupling capacitor.

FIG. 11 is a schematic perspective view showing a configuration of one of the decoupling capacitors $C_D$ in FIG. 9. FIGS. 12 to 14 are schematic perspective views in which a part of the configuration from FIG. 11 is omitted for clarity.

As shown in FIG. 11, the decoupling capacitor $C_D$ includes the impurity region $S_N$ provided on the semiconductor substrate S, an insulating layer 101 provided on the upper surface of the semiconductor substrate S, a semiconductor layer 102 provided on an upper surface of the insulating layer 101, an insulating layer 103 provided on an upper surface of the semiconductor layer 102, a semiconductor layer 104 provided on an upper surface of the insulating layer 103, and a conductive layer 105 provided on an upper surface of the semiconductor layer 104. As shown in FIGS. 9 and 10, these configurations have a longitudinal dimension (long dimension) in the Y direction and extend from a region overlapping the bonding pad electrode P when viewed from the Z direction to a region not overlapping the bonding pad electrode P when viewed from the Z direction.

The insulating layer 101 contains, for example, silicon oxide ($SiO_2$).

The semiconductor layer 102 contains polycrystalline silicon containing an N-type impurity such as phosphorus (P) or arsenic (As), or a P-type impurity such as boron (B). As shown in FIGS. 5 and 6, a lower surface of the semiconductor layer 102 faces an upper surface of the impurity region $S_N$ with the insulating layer 101 interposed therebetween.

As shown in FIG. 5, the impurity regions $S_N$, the insulating layers 101, and the semiconductor layers 102 in two decoupling capacitors $C_D$ adjacent in the X direction are separated from each other via an insulating layer STI (a shallow trench isolation feature). As shown in FIG. 6, the impurity regions $S_N$, the insulating layers 101, and the semiconductor layers 102 in the pairs of decoupling capacitors $C_D$ adjacent to each other in the Y direction are separated from each other via the insulating layer STI. The insulating layer STI contains, for example, silicon oxide ($SiO_2$).

The insulating layer 103 contains, for example, silicon oxide ($SiO_2$). As shown in FIG. 14, an opening $OP_{103}$ is provided in the insulating layer 103. The opening $OP_{103}$ extends lengthwise in the Y direction. Opening $OP_{103}$ may be referred to as a trench or a slot in some contexts. In the illustrated example, the insulating layer 103 is divided by the presence of opening $O_{P103}$ into an insulating layer 103a and an insulating layer 103b that are two discrete parts spaced from each other in the X direction with the opening $OP_{103}$ interposed therebetween. Lower surfaces of the insulating layer 103a and the insulating layer 103b are on the upper surfaces of both the semiconductor layer 102 and an insulating layer STI.

The semiconductor layer 104 (FIG. 11) contains polycrystalline silicon containing an N-type impurity such as phosphorus (P) or arsenic (As), or a P-type impurity such as boron (B). As shown in FIG. 11, the semiconductor layer 104 includes a semiconductor layer 104a and a semiconductor layer 104b, which are separated from each other in the X direction, as well as a semiconductor layer 104c provided therebetween. A semiconductor layer 104d is connected to one end, in the Y direction, of the semiconductor layer 104c. Thus, as depicted in FIG. 11, semiconductor layer 104c and semiconductor layer 104d for a T-shaped arrangement.

As shown in FIG. 11, the semiconductor layer 104a has a longitudinal dimension in the Y direction. A lower surface of the semiconductor layer 104a faces a region 102a (FIG. 13), which is a part of the semiconductor layer 102, with the insulating layer 103a interposed therebetween (FIG. 14).

As shown in FIG. 11, the semiconductor layer 104b has a longitudinal dimension in the Y direction. A lower surface of the semiconductor layer 104b faces a region 102b (FIG. 13), which is a part of the semiconductor layer 102, with the insulating layer 103b interposed therebetween (FIG. 14).

As shown in FIG. 11, the semiconductor layer 104c has a longitudinal dimension in the Y direction. A lower surface of the semiconductor layer 104c is connected to a region 102c (FIG. 13), which is a part of the semiconductor layer 102, with the opening $OP_{103}$ (FIG. 14) of the insulating layer 103 interposed therebetween.

As shown in FIG. 11, the semiconductor layer 104d has a longitudinal dimension in the X direction. A lower surface of the semiconductor layer 104d is connected to a region 102d (FIG. 13) which is a part of the semiconductor layer 102. The semiconductor layer 104d and the insulating layer 103a partially overlap when viewed from the Z direction (FIG. 6).

The conductive layer 105 (FIG. 11) contains tungsten silicide (WSi) or the like. As shown in FIG. 11, the conductive layer 105 includes two conductive layers 105a and 105b arranged in the X direction, a conductive layer 105c provided therebetween, and a conductive layer 105d connected to one end part in the Y direction of the conductive layer 105c.

The conductive layer 105a has a longitudinal dimension in the Y direction. A lower surface of the conductive layer 105a is connected to an upper surface of the semiconductor layer 104a. As shown in FIG. 10, the conductive layer 105a extends in the Y direction along an end part in the X direction of the impurity region $S_N$. However, the conductive layer 105a does not reach an end part in the Y direction of the impurity region $S_N$. Therefore, a corner part $S_{NE}$ of the impurity region $S_N$ is not covered by the conductive layer 105a. The same applies to the semiconductor layer 104a.

The conductive layer 105b has a longitudinal dimension in the Y direction. A lower surface of the conductive layer 105b is connected to an upper surface of the semiconductor layer 104b. As shown in FIG. 10, the conductive layer 105b extends in the Y direction along the end part in the X direction of the impurity region $S_N$. However, the conductive layer 105b does not reach the end part in the Y direction of the impurity region $S_N$. Therefore, the corner part $S_{NE}$ of the impurity region $S_N$ is not covered by the conductive layer 105b. The same applies to the semiconductor layer 104b.

The conductive layer 105c has a longitudinal dimension in the Y direction. A lower surface of the conductive layer 105c is connected to an upper surface of the semiconductor layer 104c. As shown in FIG. 10, the conductive layer 105c extends in the Y direction and reaches one Y-direction end of the impurity region $S_N$. The same applies to the semiconductor layer 104c.

The conductive layer 105d has a longitudinal dimension in the X direction. A lower surface of the conductive layer 105d is connected to an upper surface of the semiconductor layer 104d.

The contact electrodes $CS_{VSS}$ are electrically connected to the bonding pad electrodes P to which the ground voltage VSS is supplied. The contact electrodes $CS_{VSS}$ are via contact electrodes extending in the Z direction, and contains, for example, titanium nitride (TiN) and tungsten (W). A plurality of contact electrodes $CS_{VSS}$ exemplified in FIG. 11 are provided in the X direction, and are connected to an upper surface of the conductive layer 105d. Upper ends of the contact electrodes $CS_{VSS}$ are connected to the wirings mX that function as the voltage transfer lines $W_{VSS}$ in the wiring groups WG (described with reference to FIG. 8). The lower surfaces of the conductive layer 105d and the conductive layer 105c are connected to the upper surfaces of the semiconductor layer 104d and the semiconductor layer 104c. The lower surfaces of the semiconductor layer 104d and the semiconductor layer 104c are connected to upper surfaces of the semiconductor layer 102d and the semiconductor layer 102c. Accordingly, the ground voltage VSS is supplied to the semiconductor layers 102a and 102b.

The contact electrodes $CS_{VCCQ}$ are electrically connected to the bonding pad electrodes P to which the drive voltage VCCQ is supplied. The contact electrodes $CS_{VCCQ}$ are via contact electrodes extending in the Z direction, and contains, for example, titanium nitride (TiN) and tungsten (W).

Some contact electrodes $CS_{VCCQ}$ in FIG. 11 are arrayed in the Y direction and are connected to an upper surface of the conductive layer 105a. Some contact electrodes $CS_{VCCQ}$ in FIG. 11 are also arrayed in the Y direction and are connected to an upper surface of the conductive layer 105b. Upper ends of the contact electrodes $CS_{VCCQ}$ are connected to wirings mX that function as voltage transfer lines $W_{VCCQ}$ in the wiring groups WG (described with reference to FIG. 8). The lower surfaces of the conductive layer 105a and the conductive layer 105b are connected to the upper surfaces of the semiconductor layer 104a and the semiconductor layer 104b. Accordingly, the drive voltage VCCQ is supplied to the semiconductor layers 104a and 104b.

As shown in more clearly in FIG. 12, some contact electrodes $CS_{VCCQ}$ in FIG. 11 are arrayed in the X direction and are connected to the semiconductor substrate S. As shown in FIG. 6, the impurity region $S_{N+}$ is provided at a connection part of the semiconductor substrate S and the contact electrodes $CS_{VCCQ}$. The upper ends of the contact electrodes $CS_{VCCQ}$ are connected to the wirings mX that function as the voltage transfer lines $W_{VCCQ}$ in the wiring groups WG (described with reference to FIG. 8). Accordingly, the drive voltage VCCQ is supplied to the impurity region $S_N$ of the semiconductor substrate S.

Comparative Example

Figure 15:
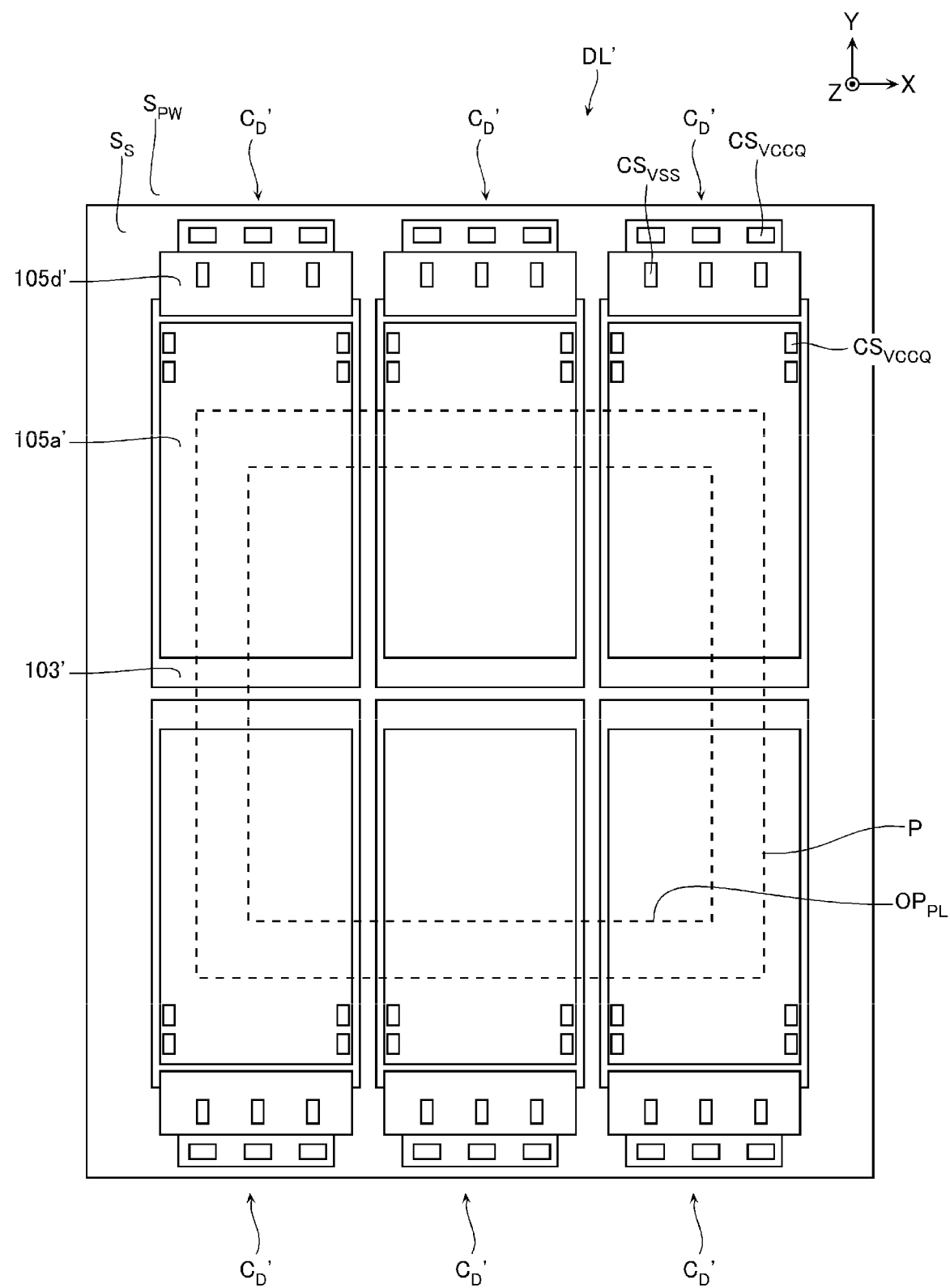
FIG. 15 is a schematic plan view showing a configuration of a device layer according to a comparative example.
Figure 16:
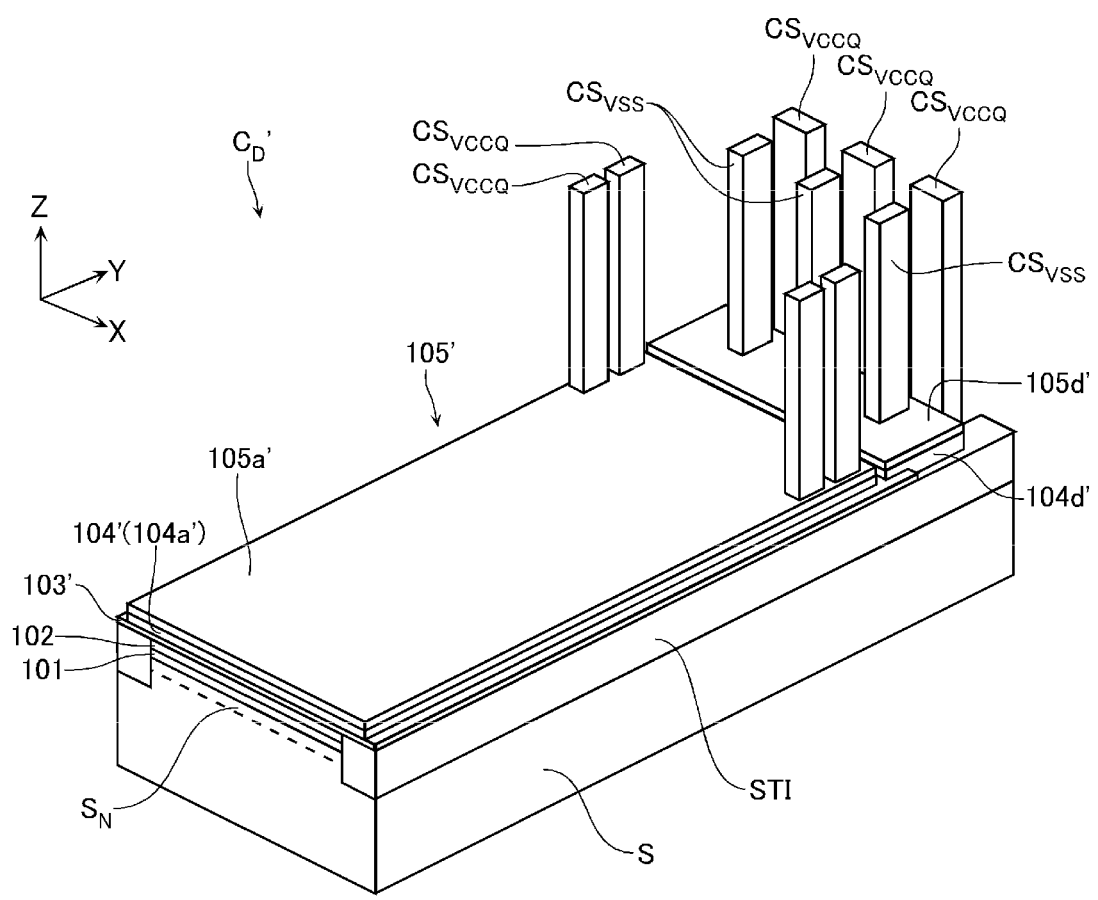
FIG. 16 is a schematic perspective view showing a configuration of a decoupling capacitor according to a comparative example.
Figure 17:
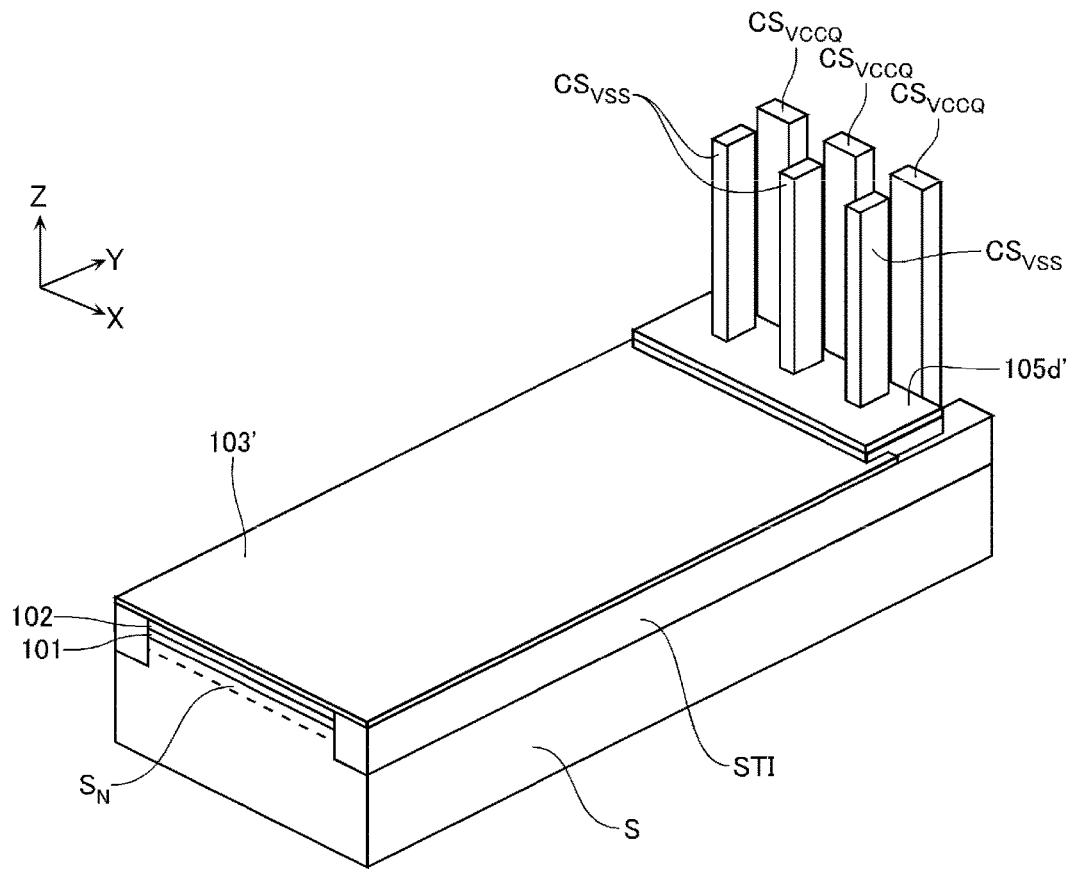
FIG. 17 is a schematic perspective view showing a configuration of a part of the decoupling capacitor of the comparative example.

Next, a memory die according to a comparative example will be described with reference to FIGS. 15 to 17. FIG. 15 is a schematic plan view showing a configuration of a part of the memory die according to the comparative example. FIG. 16 is a schematic perspective view showing a part of the configuration shown in FIG. 15. FIG. 17 is a schematic perspective view in which a part of the configuration is omitted from FIG. 16.

Unlike the memory die according to the first embodiment, the memory die according to the comparative example does not include the decoupling capacitors $C_D$. Instead, the memory die according to the comparative example includes decoupling capacitors $C_D'$.

As shown in FIG. 16, each decoupling capacitor $C_D'$ according to the comparative example includes the impurity region $S_N$, the insulating layer 101 provided on the upper surface of the semiconductor substrate S, the semiconductor layer 102 provided on the upper surface of the insulating layer 101, an insulating layer 103' provided on the upper surface of the semiconductor layer 102, a semiconductor layer 104' provided on an upper surface of the insulating layer 103', and a conductive layer 105' provided on an upper surface of the semiconductor layer 104'. As shown in FIG. 15, these configurations have a longitudinal dimension (long dimension) in the Y direction and extend from the region overlapping the bonding pad electrode P (when viewed from the Z direction) to the region not overlapping the bonding pad electrode P (when viewed from the Z direction).

The insulating layer 103' (FIG. 16) is similar to the insulating layer 103 (FIG. 12). However, as shown in FIG. 17, the insulating layer 103' does not have the opening $OP_{103}$ (FIG. 14), and is not divided into two parts.

A semiconductor layer 104' (FIG. 16) contains polycrystalline silicon containing an N-type impurity such as phosphorus (P) or arsenic (As), or a P-type impurity such as boron (B). As shown in FIG. 16, the semiconductor layer 104' includes a semiconductor layer 104a' and a semiconductor layer 104d' that are two parts arranged in the Y direction. A lower surface of the semiconductor layer 104a' faces a partial region of the upper surface of the semiconductor layer 102 with the insulating layer 103' interposed therebetween. A lower surface of the semiconductor layer 104d' is connected to an upper surface of a partial region of the semiconductor layer 102.

The conductive layer 105' contains tungsten silicide (WSi) or the like. The conductive layer 105' includes a conductive layer 105a' and a conductive layer 105d' that are two parts arranged in the Y direction. A lower surface of the conductive layer 105a' is connected to an upper surface of the semiconductor layer 104a'. A lower surface of the conductive layer 105d' is connected to the upper surface of the semiconductor layer 104a'.

A plurality of contact electrodes $CS_{VSS}$ exemplified in FIG. 17 are provided in the X direction, and are connected to an upper surface of the conductive layer 105d'. Accordingly, the ground voltage VSS is supplied to the semiconductor layer 102. As shown in FIG. 15, the contact electrodes $CS_{VSS}$ are provided at positions not overlapping the bonding pad electrode P when viewed from the Z direction.

Effect

When the bonding wires B (see FIGS. 1 and 2) are attached to the bonding pad electrodes P, the bonding pad electrodes P are pressed downward by a capillary. At this time, a stress is applied to the wirings mX, m0 and m1 via the bonding pad electrodes P. If the wirings mX, m0 and m1 are provided in a region where such a stress is generated, the stress may be concentrated in the insulating layers in the vicinity of the wirings mX, m0 and m1, and cracks may be generated in the insulating layers. Thus, when the capillary moves upward it is possible a partial structure including the bonding pad electrodes P may be peeled off from the semiconductor substrate S together with the bonding wires B. In order to prevent such a phenomenon, in the comparative example, for example, the wirings mX, m0 and m1 are not provided in the bonding region BB corresponding to the contact surface of the bonding pad electrode P and the bonding wire B.

Here, the plurality of contact electrodes $CS_{VSS}$ and $CS_{VCCQ}$ connected to the decoupling capacitors $C_D'$ are connected to the wirings mX in the wiring groups WG (described with reference to FIG. 8) at the upper ends. Therefore, when the wiring groups WG are provided in the region so as not to be overlapping the bonding pad electrode P. The contact electrodes $CS_{VSS}$ and $CS_{VCCQ}$ are also provided in the region so as not to be overlapping the bonding pad electrode P. In the decoupling capacitors $C_D'$ according to the comparative example, the impurity region $S_N$, the semiconductor layer 102, and the semiconductor layer 104' that function as electrodes of the capacitor are connected to the contact electrodes $CS_{VSS}$ and $CS_{VCCQ}$ only in a region not overlapping the bonding pad electrode P.

A resistivity of the semiconductor layer 102 is higher than a resistivity of the conductive layer 105' (FIG. 16). Therefore, when a signal frequency of the input and output signal lines $W_{IO0}$, $W_{IO1}$, $W_{IO2}$, $W_{IO3}$ ... (described with reference to FIG. 4) increases, a part of the semiconductor layer 102 provided relatively far from the conductive layer 105d' may poorly function as a capacitor. In such a case, a voltage of the input and output signal lines $W_{IO0}$, $W_{IO1}$, $W_{IO2}$, $W_{IO3}$ . . . may become unstable.

As described with reference to FIG. 14, in the decoupling capacitor $C_D$ according to the first embodiment, the opening $OP_{103}$ extending in the Y direction is provided in the insulating layer 103. As described with reference to FIG. 11, the semiconductor layer 104c is connected to the upper surface of the semiconductor layer 102 via the opening $OP_{103}$. The conductive layer 105c is connected to the upper surface of the semiconductor layer 104c.

According to such a configuration, the entire semiconductor layer 102 can be brought close to the conductive layer 105d via the conductive layer 105c. Accordingly, charging and discharging of the semiconductor layer 102 can be accelerated still without disposing the contact electrodes $CS_{VSS}$ or the like in the bonding region BB (see FIG. 7). Therefore, peeling of the bonding pad electrode P as described above can be prevented, and capacitance value attenuation accompanying increases in the signal frequency can be prevented.

Figure 18:
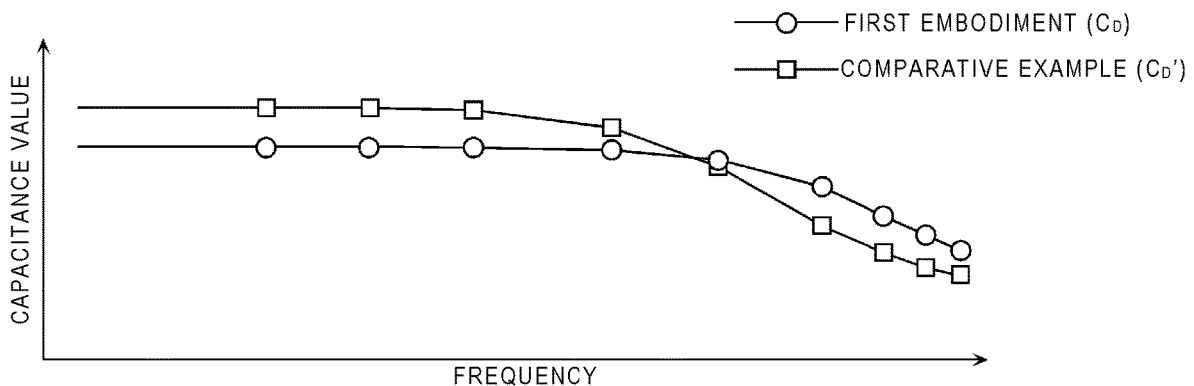
FIG. 18 is a graph of frequency characteristics of the decoupling capacitors of a first embodiment and a comparative example.

FIG. 18 is a graph showing a relationship between signal frequencies and capacitance values of the decoupling capacitors $C_D$ and $C_D'$. Characteristics for the decoupling capacitor $C_D$ among the characteristics shown in FIG. 18 show a simulation result for the capacitance value between the upper surface of the semiconductor layer 102 and a lower surface of the semiconductor layer 104. Characteristics for the decoupling capacitor $C_D'$ among the characteristics shown in FIG. 18 show a simulation result for the capacitance value between an upper surface of the semiconductor layer 102' and a lower surface of the semiconductor layer 104'.

When the signal frequency is relatively low, the capacitance value of the decoupling capacitor $C_D'$ is larger than the capacitance value of the decoupling capacitor $C_D$. A possible reason for the relationship is considered to be that in the decoupling capacitor $C_D$, charges are not accumulated since the semiconductor layer 104 does not face the semiconductor layer 102c (FIG. 13) with the insulating layer 103 interposed therebetween.

When the signal frequency is relatively high, the capacitance value of the decoupling capacitor $C_D$ is larger than the capacitance value of the decoupling capacitor $C_D'$. One possible reason for the relationship is considered to be that in the decoupling capacitor $C_D'$, a partial region of the semiconductor layer 102 is far from the conductive layer 105d', and the charging and discharging speed in such a part is low. Another possible reason for the relationship is considered to be that in the decoupling capacitor $C_D$, the entire semiconductor layer 102 is provided in the vicinity of the conductive layer 105d, and charging and discharging are performed at a high speed in the regions 102a and 102b of the semiconductor layer 102.

Second Embodiment

Figure 19:
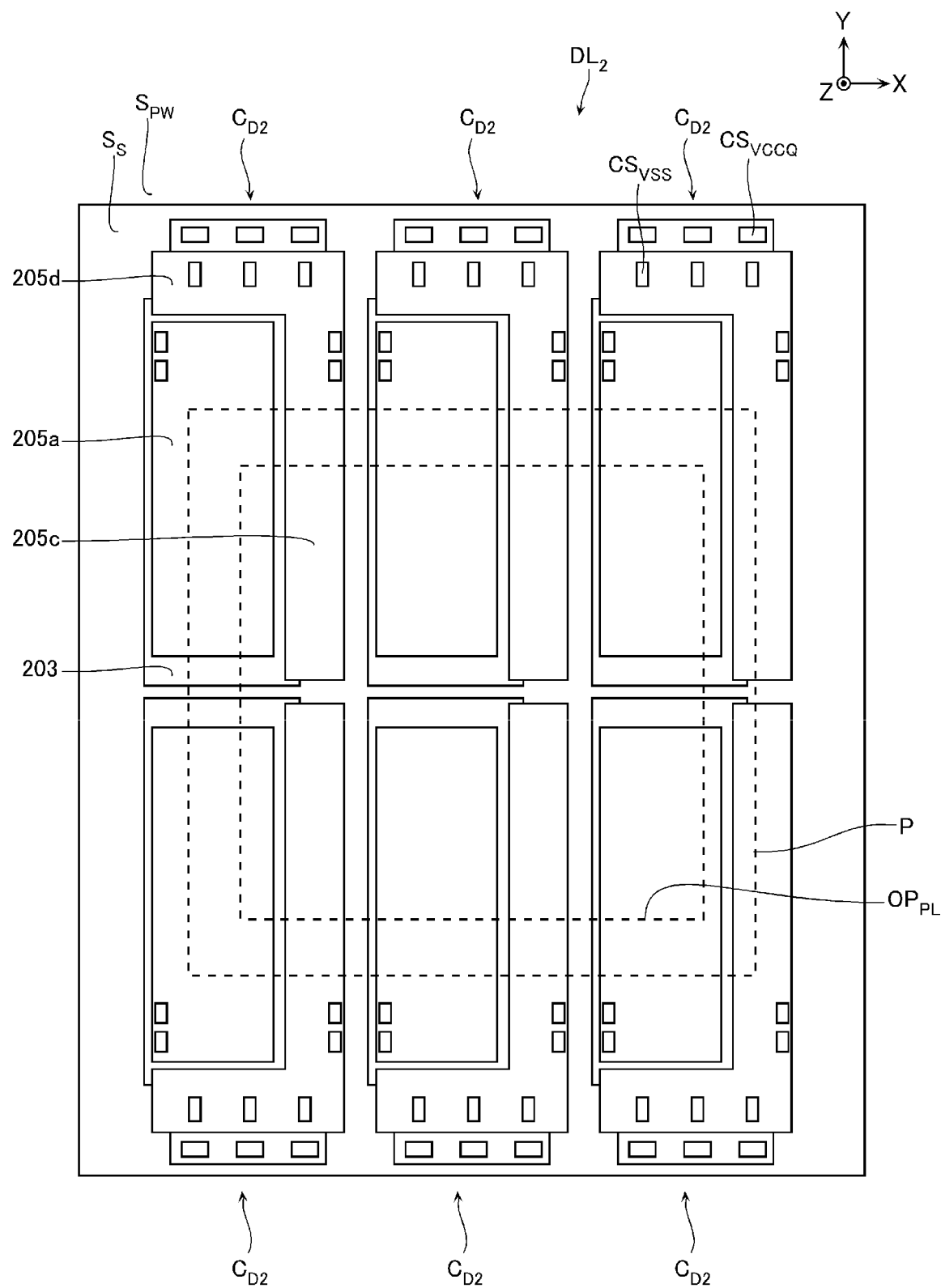
FIG. 19 is a schematic plan view showing a configuration of a device layer according to a second embodiment.
Figure 20:
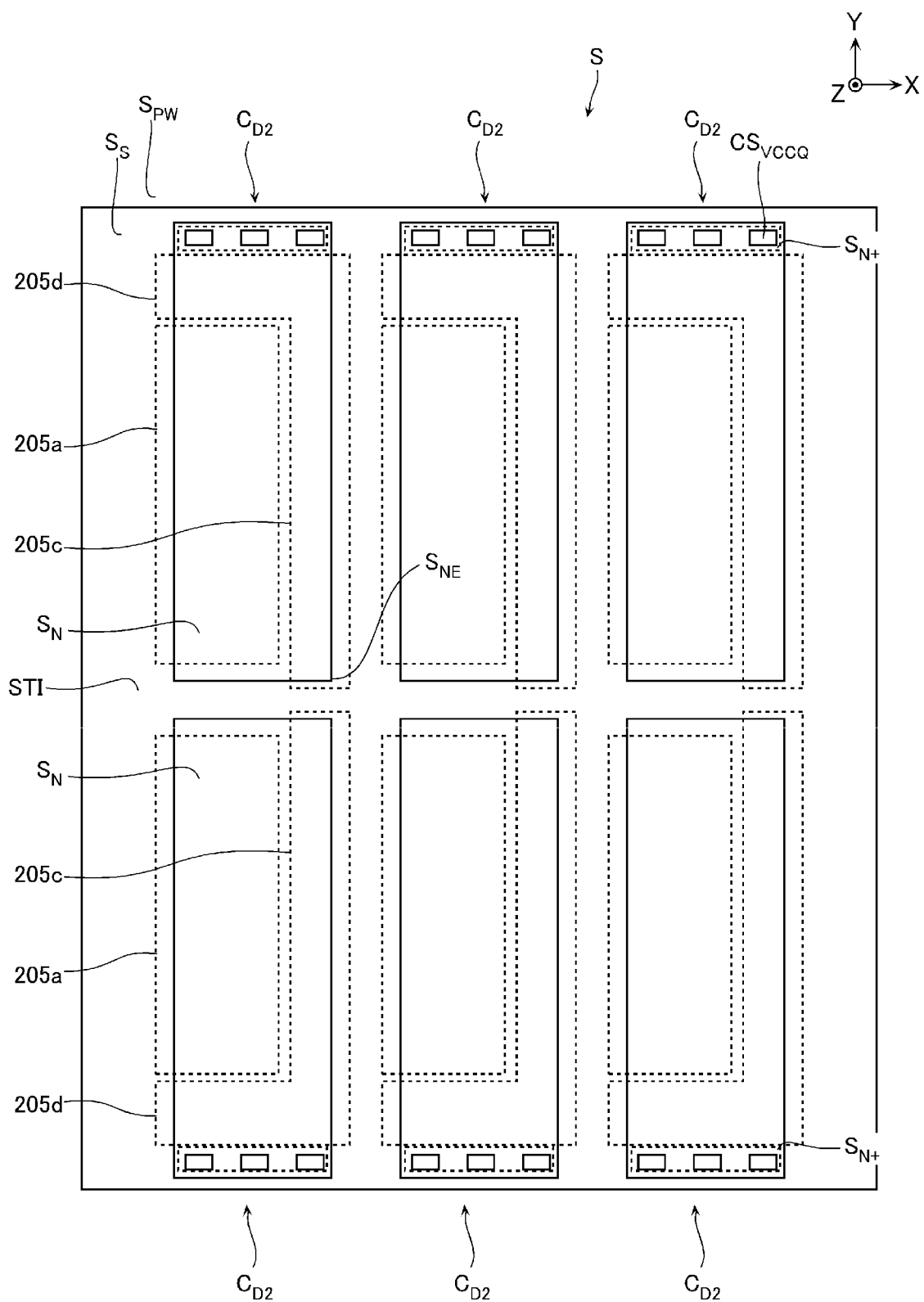
FIG. 20 is a schematic plan view showing a configuration of a semiconductor substrate according to a second embodiment.
Figure 21:
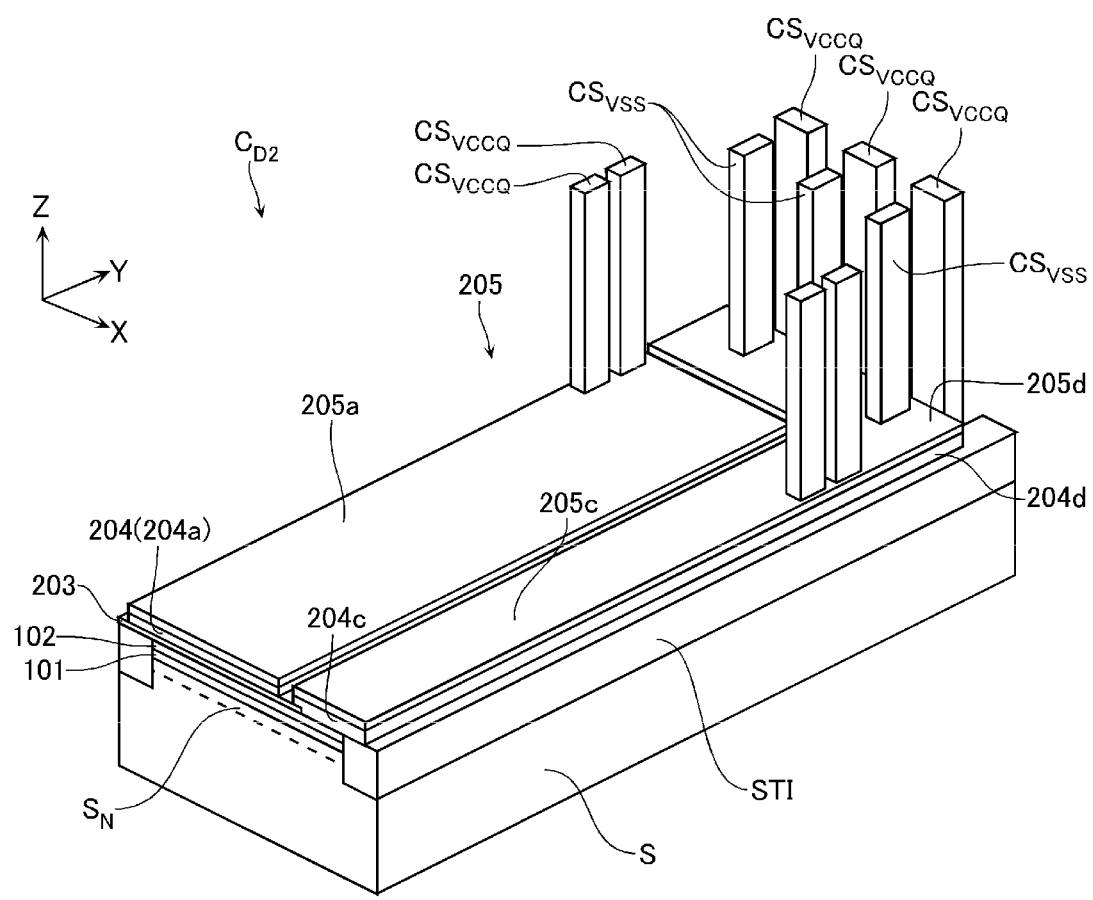
FIG. 21 is a schematic perspective view showing a configuration of a decoupling capacitor according to a second embodiment.

Next, a memory die according to a second embodiment will be described with reference to FIGS. 19 to 21. FIGS. 19 and 20 are schematic plan views showing a configuration of the memory die according to the second embodiment. FIG. 21 is a schematic perspective view showing the memory die according to the second embodiment. In the following description, elements identical to those of the first embodiment are denoted by the same reference numerals, and descriptions thereof are omitted.

The memory die according to the second embodiment is similar to the memory die MD according to the first embodiment. However, instead of including the decoupling capacitors $C_D$, the memory die according to the second embodiment includes decoupling capacitors $C_{D2}$. Each decoupling capacitor $C_{D2}$ is similar to the decoupling capacitor $C_D$ according to the first embodiment. However, instead of including the insulating layer 103, the semiconductor layer 104, and the conductive layer 105, the decoupling capacitor $C_{D2}$ include an insulating layer 203, a semiconductor layer 204, and a conductive layer 205.

The insulating layer 203 is similar to the insulating layer 103. However, the insulating layer 203 does not have the opening $OP_{103}$ (FIG. 14), and is not divided into two parts. The insulating layer 203 does not cover the end part on one side in the X direction of the semiconductor layer 102.

The semiconductor layer 204 is similar to the semiconductor layer 104. However, the semiconductor layer 204 only includes a semiconductor layer 204a corresponding to the semiconductor layer 104a, a semiconductor layer 204c corresponding to the semiconductor layer 104c, and a semiconductor layer 204d corresponding to the semiconductor layer 104d, and does not include a semiconductor layer 204b corresponding to the semiconductor layer 104b. The semiconductor layer 204c is connected to an upper surface of a part of the semiconductor layer 102 not covered by the insulating layer 203.

The conductive layer 205 is similar to the conductive layer 105. However, the conductive layer 205 only includes a conductive layer 205a corresponding to the conductive layer 105a, a conductive layer 205c corresponding to the conductive layer 105c, and a conductive layer 205d corresponding to the conductive layer 105d, and does not include a conductive layer 205b corresponding to the conductive layer 105b.

As shown in FIG. 20, in the second embodiment, the conductive layer 205c covers one end part in the X direction of the impurity region $S_N$ and one end part in the Y direction of the impurity region $S_N$. Accordingly, the corner part $S_{NE}$ of the impurity region $S_N$ is covered with the conductive layer 205c.

Third Embodiment

Figure 22:
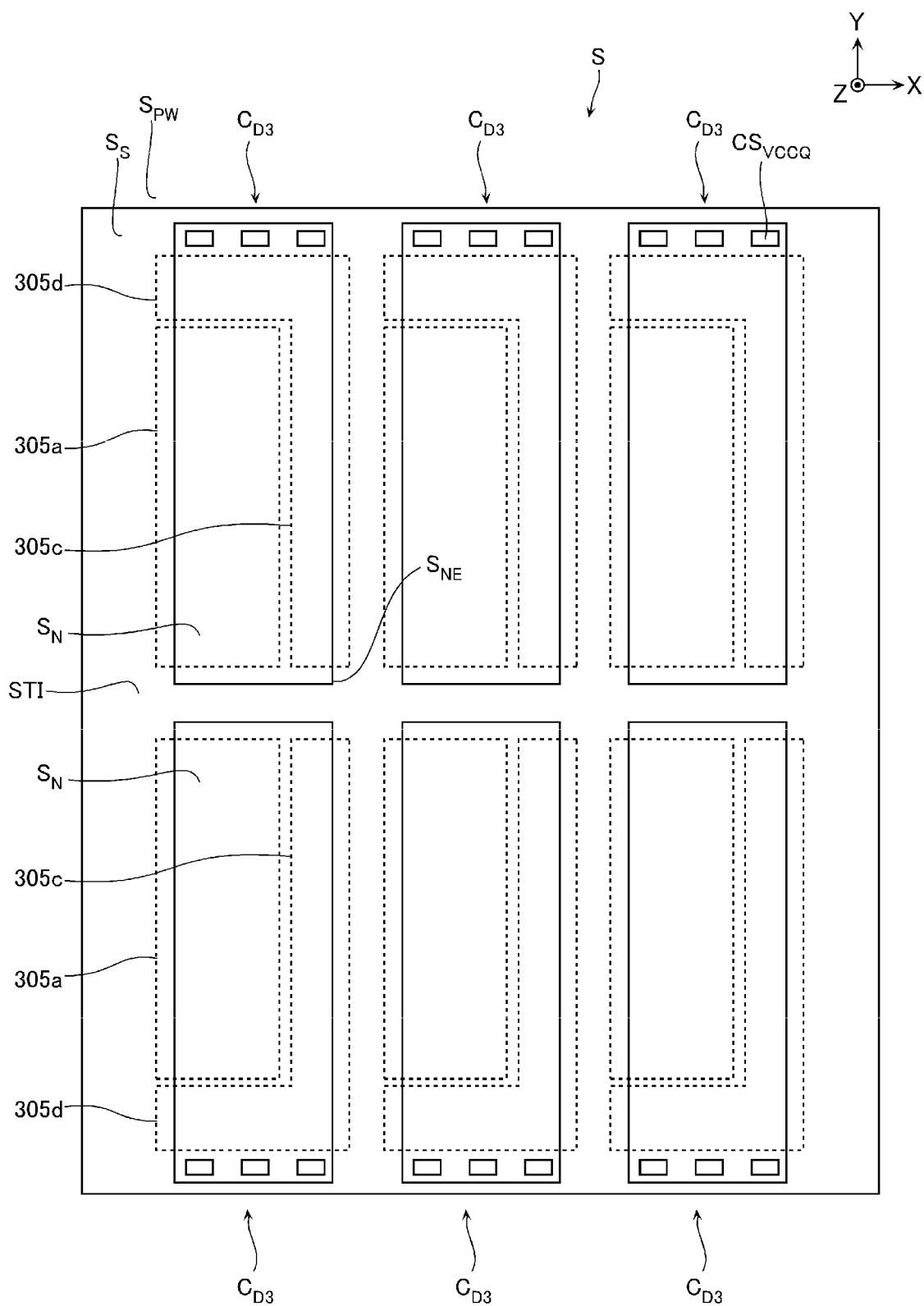
FIG. 22 is a schematic plan view showing a configuration of a decoupling capacitor according to a third embodiment.
Figure 23:
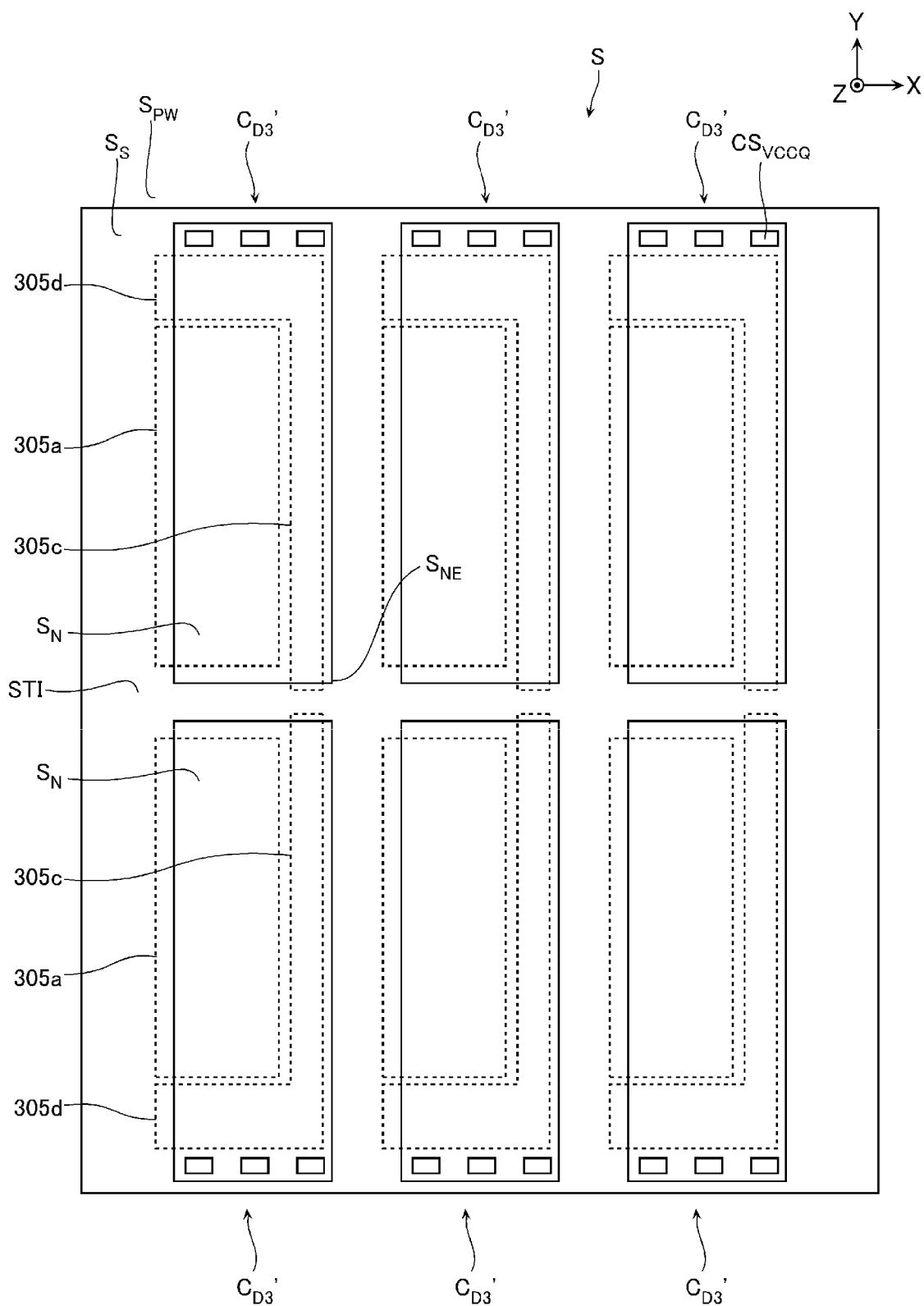
FIG. 23 is a schematic plan view showing a configuration of the semiconductor substrate according to a third embodiment.

Next, a memory die according to a third embodiment will be described with reference to FIGS. 22 and 23. FIG. 22 is a schematic plan view showing a configuration of the memory die according to the third embodiment. A schematic perspective view showing the memory die according to the third embodiment is similar to that in FIG. 21. FIG. 23 is a schematic plan view showing a configuration of the memory die according to the comparative example. In the following description, elements identical to those of the second embodiment are denoted by the same reference numerals, and additional descriptions thereof are omitted.

The memory die according to the third embodiment is configured similarly to the memory die according to the second embodiment. However, instead of including the decoupling capacitors $C_{D2}$, the memory die according to the third embodiment includes decoupling capacitors $C_{D3}$. Each decoupling capacitor $C_{D3}$ is configured similarly to the decoupling capacitor $C_{D2}$ according to the second embodiment. However, instead of including the semiconductor layer 204 and the conductive layer 205, the decoupling capacitor $C_{D3}$ include a semiconductor layer (not separately depicted) and a conductive layer 305.

The semiconductor layer of this third embodiment is configured similarly to the semiconductor layer 204. That is, the semiconductor layer includes a semiconductor layer corresponding to the semiconductor layer 204a, a semiconductor layer corresponding to the semiconductor layer 204c, and a semiconductor layer corresponding to the semiconductor layer 204d. However, in this embodiment, the part corresponding to the semiconductor layer 204c does not cover an end part on one side in the Y direction of the impurity region $S_N$. Therefore, in the third embodiment, the corner part $S_{NE}$ (FIG. 22) of the impurity region $S_N$ is not covered by a semiconductor layer.

The conductive layer 305 is similar to the conductive layer 205. That is, the conductive layer 305 includes a conductive layer 305a corresponding to the conductive layer 205a, a conductive layer 305c corresponding to the conductive layer 205c, and a conductive layer 305d corresponding to the conductive layer 205d. However, the conductive layer 305c does not cover one end part in the Y direction of the impurity region $S_N$. Therefore, in the third embodiment, as shown in FIG. 22, the corner part $S_{NE}$ of the impurity region $S_N$ is not covered with the conductive layer 305.

Electric field concentration may occur in the corner part $S_{NE}$ of the impurity region $S_N$. In such a case, if the corner part $S_{NE}$ of the impurity region $S_N$ is covered with a conductive layer or the like, dielectric breakdown is likely to occur in the vicinity of the corner part, and a life of the decoupling capacitor may be shortened. Therefore, in the first embodiment, the semiconductor layer 104 and the conductive layer 105 are arranged in a manner of not overlapping the corner part $S_{NE}$ of the impurity region $S_N$. Similarly, in the third embodiment, the semiconductor layer and the conductive layer 305 are arranged in such a manner so as to not overlap the corner part $S_{NE}$ of the impurity region $S_N$. According to such a configuration, a memory die having a long life compared with the second embodiment can be provided.

In a comparative example shown in FIG. 23, the semiconductor layer and the conductive layer 305 do not cover an end part on one side in the X direction of the impurity region $S_N$. Here, the semiconductor layer 102 has a longitudinal dimension in the Y direction and the semiconductor layer and the conductive layer 305 are arranged in a manner avoiding an end part on one side in the X direction (long side), a capacitance value of the decoupling capacitor $C_{D3}'$ may be lower than a capacitance value of the decoupling capacitor $C_{D3}$. Further, the capacitance value may be lower since a length of the semiconductor layer and a length of the conductive layer 305c in the Y direction in the third embodiment (see FIG. 22) is less than a length of the semiconductor layer 204c and a length of the conductive layer 205c in the Y direction in the second embodiment (see FIG. 20). In contrast, in the first embodiment, the semiconductor layer 104c connected to the semiconductor layer 102 is disposed between the semiconductor layer 104a and the semiconductor layer 104b. According to such a configuration, a decoupling capacitor $C_D$ having a long life and a high capacitance can be implemented since a decrease in the capacitance value in the X direction and a decrease in the capacitance value in the Y direction can be prevented.

Fourth Embodiment

Figure 24:
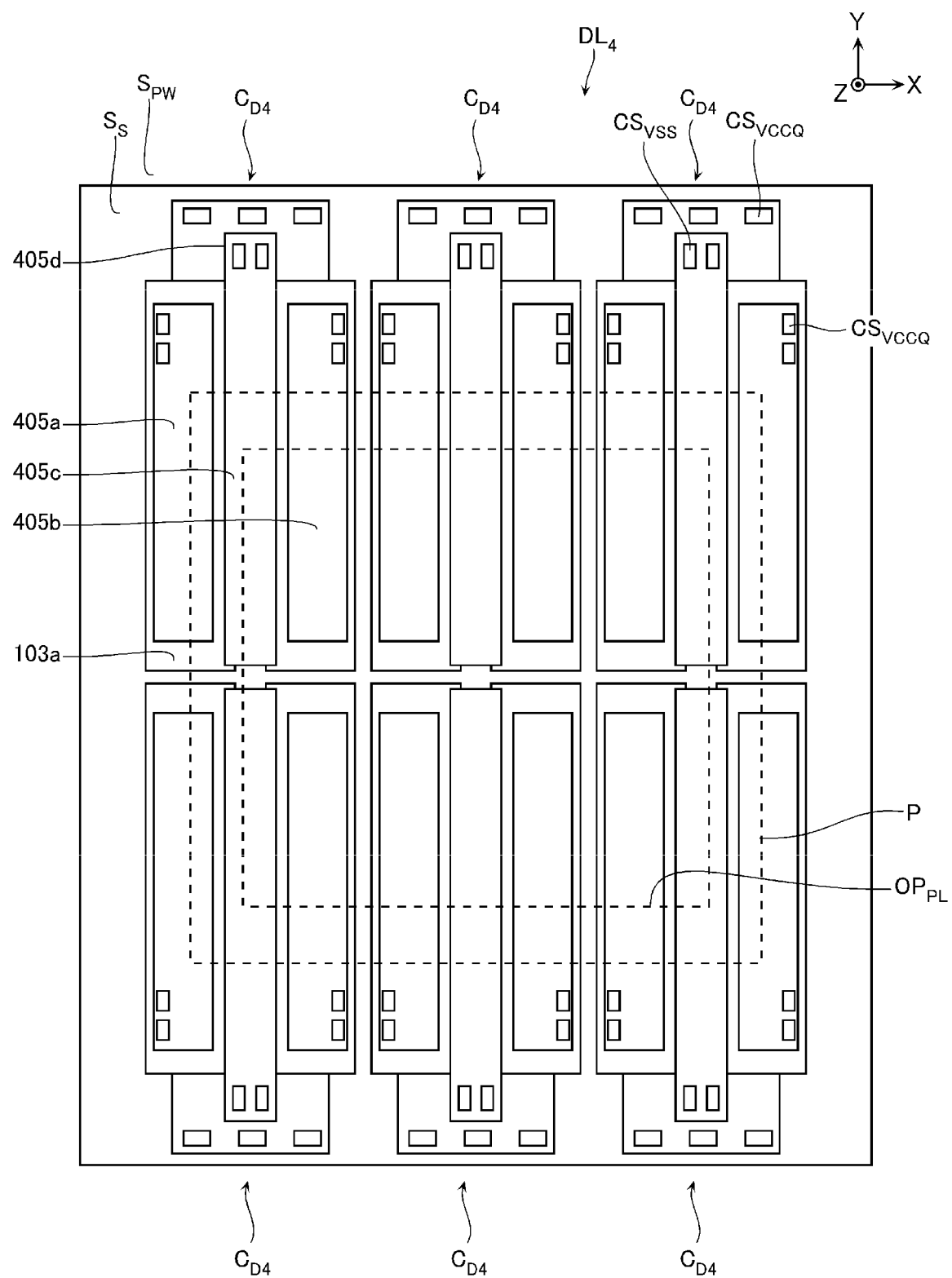
FIG. 24 is a schematic plan view showing a configuration of a device layer according to a fourth embodiment.

Next, a memory die according to a fourth embodiment will be described with reference to FIG. 24. FIG. 24 is a schematic plan view showing a configuration of the memory die according to the fourth embodiment. In the following description, elements identical to those of the first embodiment are denoted by the same reference numerals, and descriptions thereof are omitted.

The memory die according to the fourth embodiment is configured similarly to the memory die according to the first embodiment. However, instead of including the decoupling capacitors $C_D$, the memory die according to the fourth embodiment includes decoupling capacitors $C_{D4}$. Each decoupling capacitor $C_{D4}$ is configured similarly as the decoupling capacitor $C_D$ according to the first embodiment. However, instead of including the semiconductor layer 104 and the conductive layer 105, the decoupling capacitor $C_{D4}$ include a conductive layer 405 and a semiconductor layer.

The conductive layer 405 is configured similarly as the conductive layer 105. That is, the conductive layer 405 includes a conductive layer 405a corresponding to the conductive layer 105a, a conductive layer 405b corresponding to the conductive layer 105b, a conductive layer 405c corresponding to the conductive layer 105c, and a conductive layer 405d corresponding to the conductive layer 105d. However, the conductive layer 405d does not extend in the X direction.

The semiconductor layer provided between the insulating layer 103 and the conductive layer 405 is configured similarly to the semiconductor layer 104. However, a planar shape of the semiconductor layer is formed in the same manner as the conductive layer 405.

Fifth Embodiment

Figure 25:
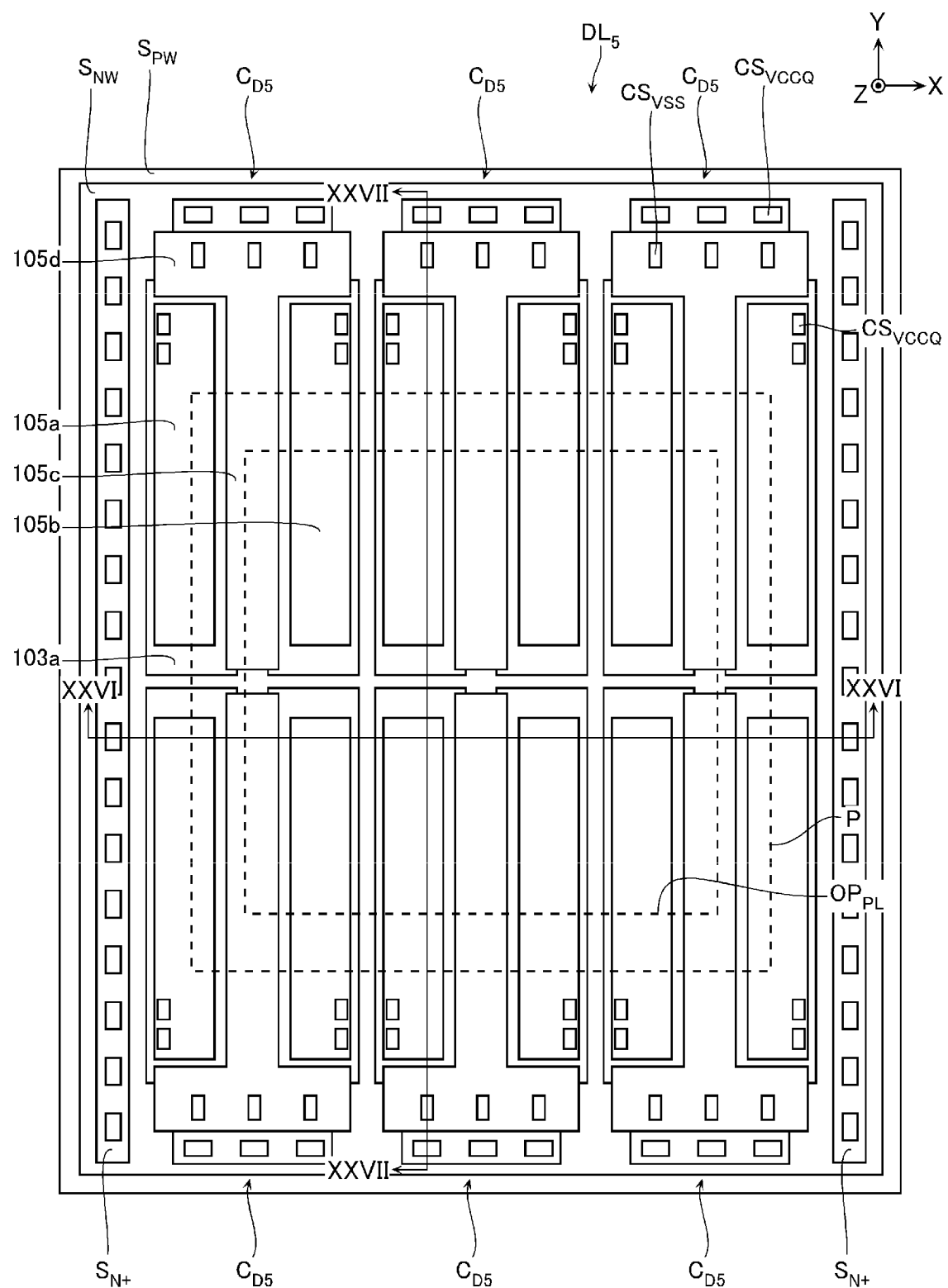
FIG. 25 is a schematic plan view showing a configuration of a device layer according to a fifth embodiment.
Figure 26:
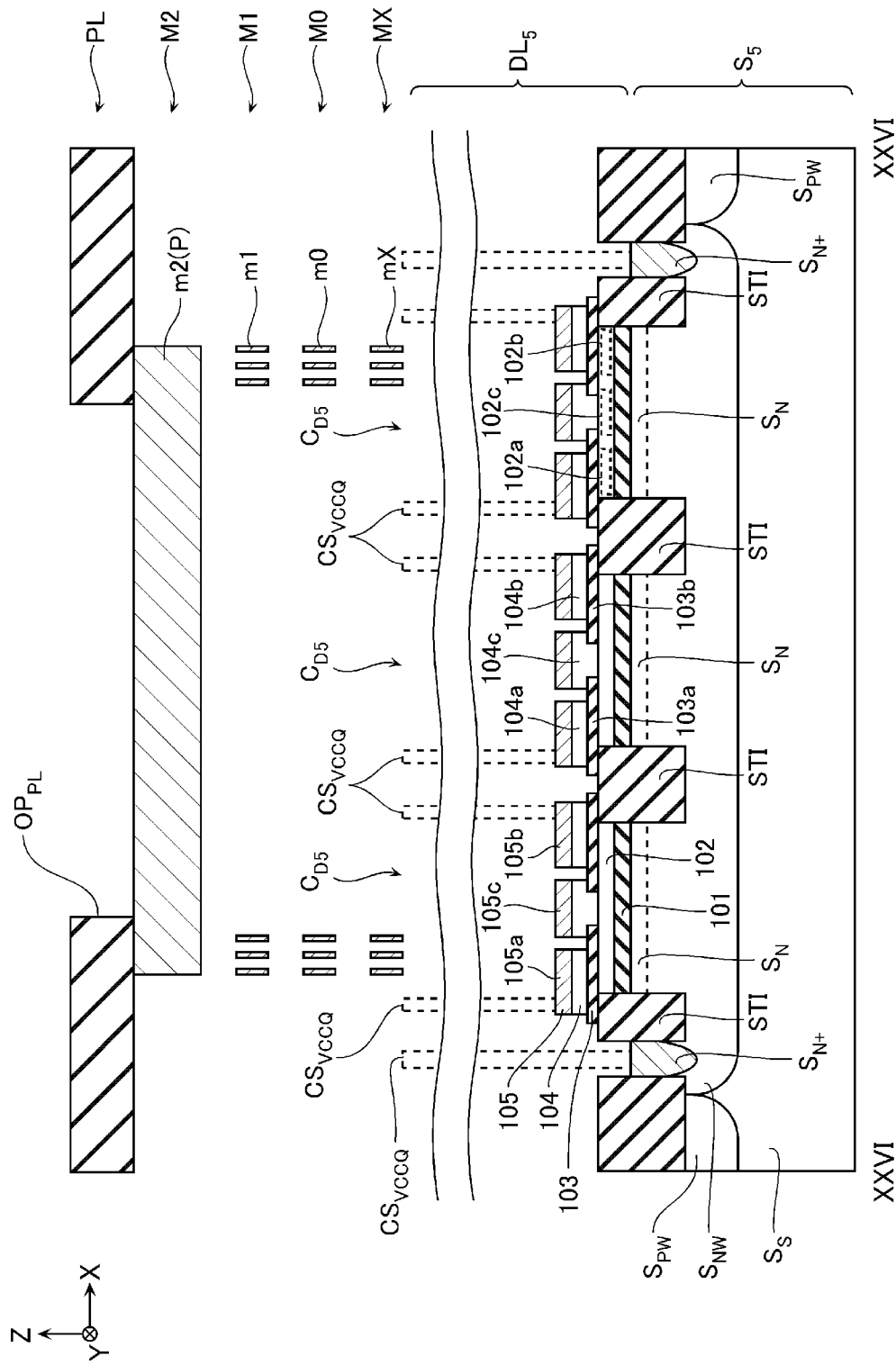
FIG. 26 is a schematic cross-sectional view obtained by cutting a structure shown in FIG. 25 along a line XXVI-XXVI.
Figure 27:
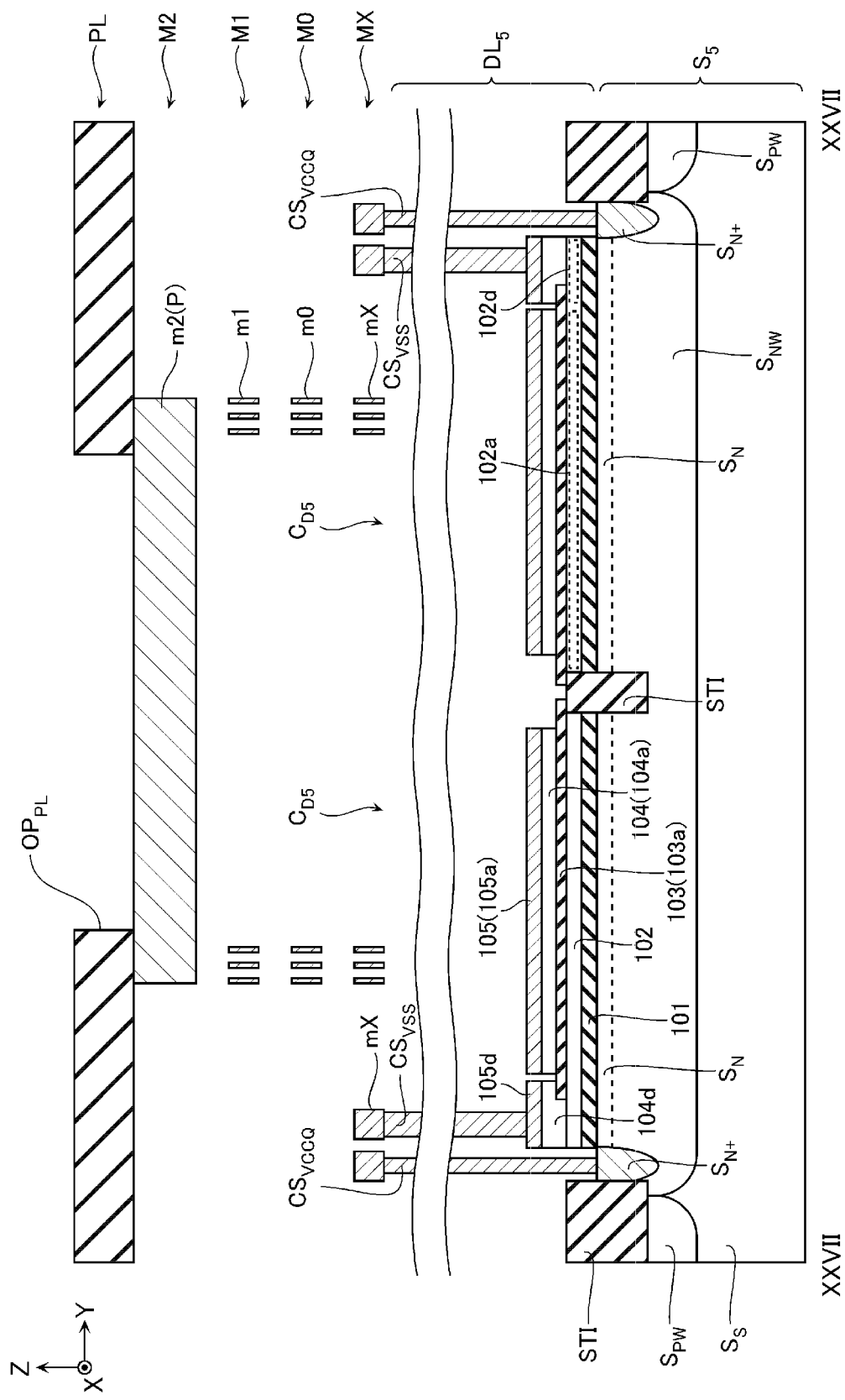
FIG. 27 is a schematic cross-sectional view obtained by cutting the structure shown in FIG. 25 along a line XXVII-XXVII.

Next, a memory die according to a fifth embodiment will be described with reference to FIGS. 25 to 28. FIG. 25 is a schematic plan view showing a configuration of the memory die according to the fifth embodiment. FIGS. 26 and 27 are schematic cross-sectional views showing a configuration of the memory die according to the fifth embodiment. In the following description, elements identical to those of the first embodiment are denoted by the same reference numerals, and descriptions thereof are omitted.

The memory die according to the fifth embodiment is configured similarly to the memory die according to the first embodiment. However, instead of including the semiconductor substrate S, the memory die according to the fifth embodiment includes a semiconductor substrate $S_5$. The semiconductor substrate $S_5$ is basically configured similarly to the semiconductor substrate S according to the first embodiment. However, as described with reference to FIG. 10, the semiconductor substrate S according to the first embodiment is provided with the semiconductor substrate region $S_S$ and the P-well region $S_{PW}$ provided in the manner of surrounding the semiconductor substrate region $S_S$, and the six decoupling capacitors $C_D$ are provided in the semiconductor substrate region $S_S$. On the other hand, as shown in FIG. 25, in the semiconductor substrate $S_5$, an N-well region $S_{NW}$ and the P-well region $S_{PW}$ surrounding the N-well region $S_{NW}$ are provided, and six decoupling capacitors $C_{D5}$ are provided in the N-well region $S_{NW}$. The N-well region $S_{NW}$ contains, for example, an N-type impurity such as phosphorus (P) or arsenic (As). In addition, the impurity region $S_{N+}$ extending in the Y direction is provided in the N-well region $S_{NW}$. The plurality of contact electrodes $CS_{VCCQ}$ arranged in the Y direction are provided in the impurity region.

Each decoupling capacitor $C_{D5}$ according to the fifth embodiment is configured similarly to the decoupling capacitor $C_D$ according to the first embodiment. However, as shown in FIGS. 26 and 27, the six impurity regions $S_N$ in the six decoupling capacitors $C_{D5}$ are electrically connected via the N-well region $S_{NW}$.

Figure 28:
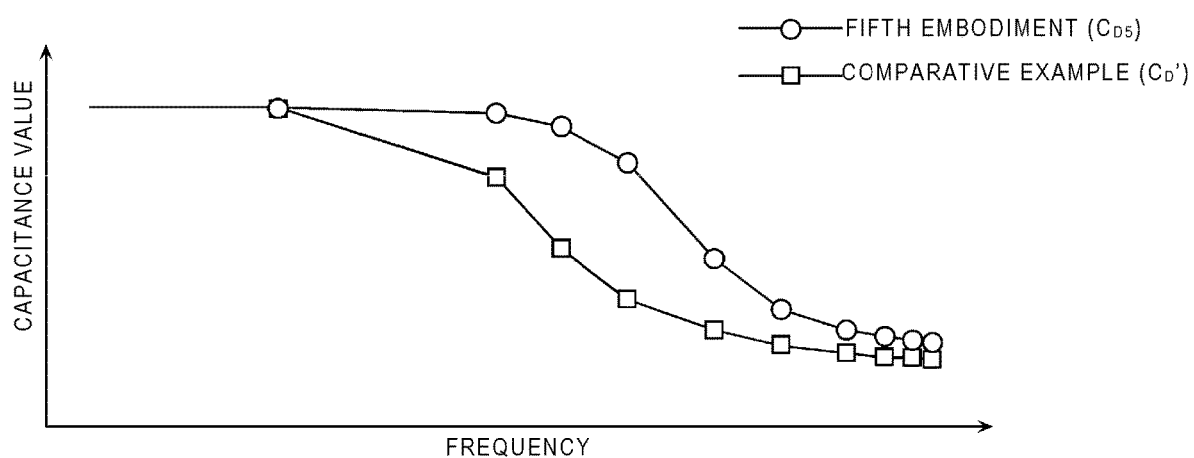
FIG. 28 is a graph of frequency characteristics of decoupling capacitors according to a fifth embodiment and a comparative example.

FIG. 28 is a graph showing a relationship between a signal frequency and a capacitance value of the decoupling capacitors $C_{D5}$ and $C_D'$. Characteristics related to the decoupling capacitor $C_{D5}$ among the characteristics shown in FIG. 28 show a simulation result related to the capacitance value between an upper surface of the semiconductor substrate $S_5$ and the lower surface of the semiconductor layer 102. Characteristics related to the decoupling capacitor $C_D'$ among the characteristics shown in FIG. 28 show a simulation result related to the capacitance value between the upper surface of the semiconductor substrate S and the lower surface of the semiconductor layer 102.

When the signal frequency is relatively low, the capacitance values of the decoupling capacitors $C_{D5}$ and $C_D'$ are approximately the same. On the other hand, when the signal frequency is relatively high, the capacitance value of the decoupling capacitor $C_{D5}$ is larger than the capacitance value of the decoupling capacitor $C_D'$. A reason for this relationship is resistivity of an upper surface of the semiconductor substrate $S_5$ is reduced by the N-well region $S_{NW}$.

As described above, according to the fifth embodiment, the resistivity of the upper surface of the semiconductor substrate $S_5$ is reduced by the N-well region $S_{NW}$, and the capacitance value attenuation accompanying the increase of the signal frequency can be further suitably prevented.

According to the fifth embodiment, a parasitic capacitance is generated by a depletion layer between the N-well region $S_{NW}$ of the semiconductor substrate $S_5$ and the semiconductor substrate region $S_S$ provided below the N-well region $S_{NW}$. Therefore, the capacitance value of the decoupling capacitor $C_{D5}$ can be increased by the parasitic capacitance.

Sixth Embodiment

Figure 29:
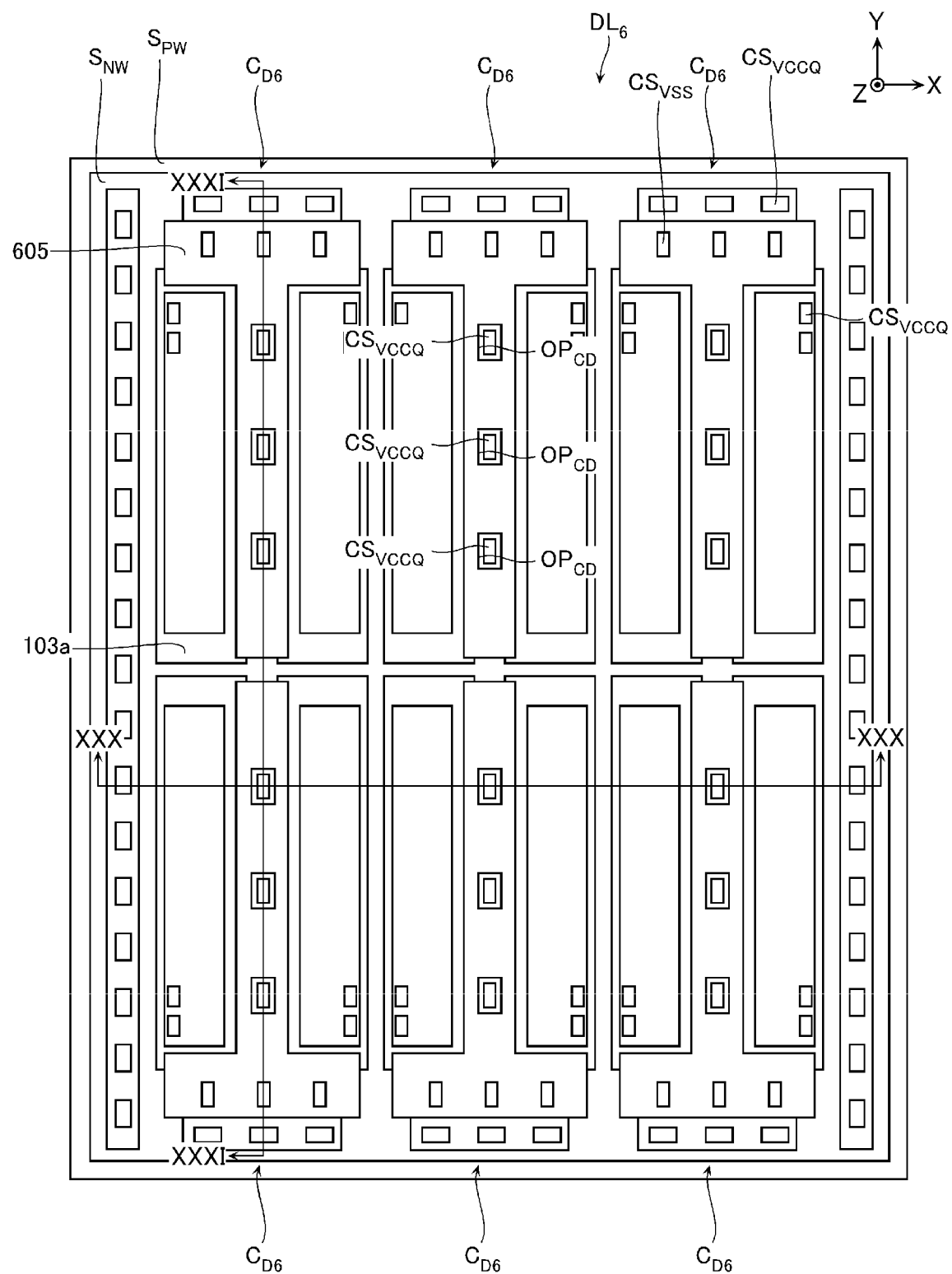
FIG. 29 is a schematic plan view showing a configuration of a device layer according to a sixth embodiment.
Figure 30:
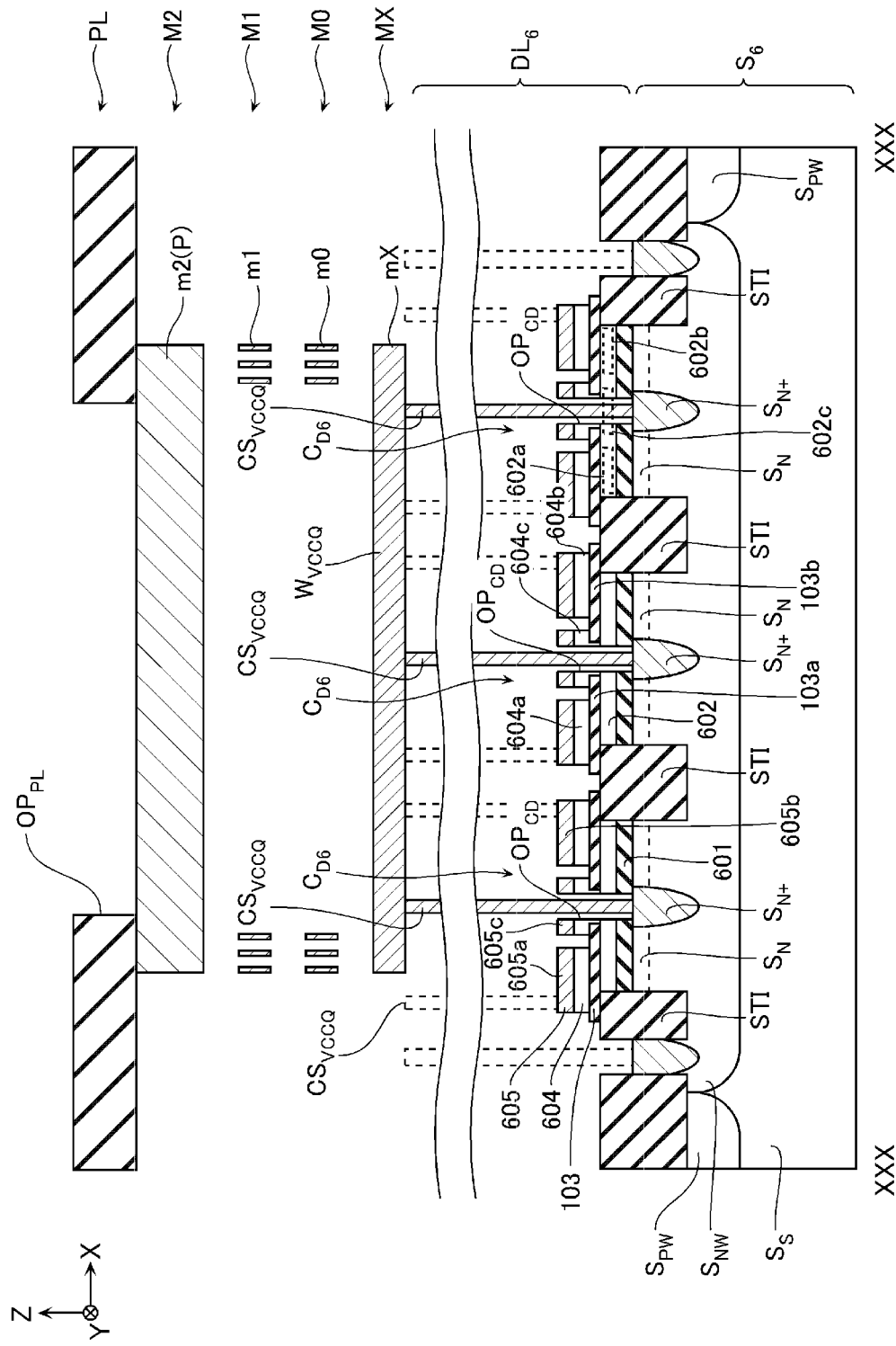
FIG. 30 is a schematic cross-sectional view obtained by cutting a structure shown in FIG. 29 along a line XXX-XXX.
Figure 31:
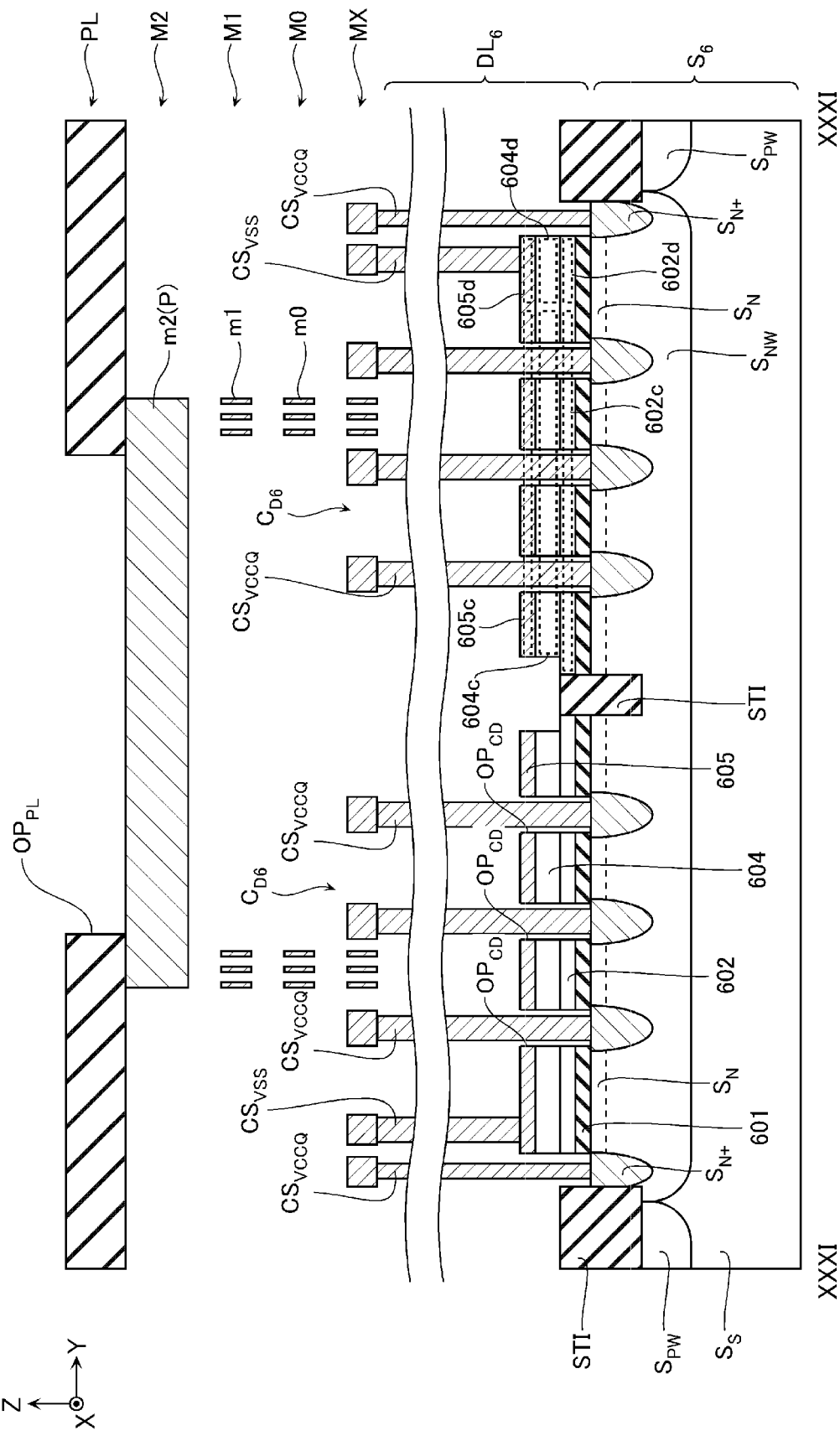
FIG. 31 is a schematic cross-sectional view obtained by cutting the structure shown in FIG. 29 along a line XXXI-XXXI.

Next, a memory die according to a sixth embodiment will be described with reference to FIGS. 29 to 31. FIG. 29 is a schematic plan view showing a configuration of the memory die according to the sixth embodiment. FIGS. 30 and 31 are schematic cross-sectional views showing the memory die according to the sixth embodiment. In the following description, elements identical to those of the fifth embodiment are denoted by the same reference numerals, and descriptions thereof are omitted.

The memory die according to the sixth embodiment is configured similarly to the memory die according to the fifth embodiment. However, instead of including the semiconductor substrate $S_5$ and the decoupling capacitors $C_{D5}$, the memory die according to the sixth embodiment includes a semiconductor substrate $S_6$ and decoupling capacitors $C_{D6}$.

Each decoupling capacitor $C_{D6}$ is basically configured similarly to the decoupling capacitor $C_{D5}$ according to the fifth embodiment. However, the decoupling capacitor $C_{D6}$ includes a plurality of through via holes $OP_{CD}$ by which the upper surface of the semiconductor substrate $S_6$ is exposed. That is, the decoupling capacitor $C_{D6}$ includes an insulating layer 601 instead of the insulating layer 101, as shown in FIGS. 30 and 31. The decoupling capacitor $C_{D6}$ includes a semiconductor layer 602 instead of the semiconductor layer 102. Instead of the region 102a, the region 102b, the region 102c, and the region 102d in the semiconductor layer 102, the semiconductor layer 602 includes a region 602a, a region 602b, a region 602c, and a region 602d. The decoupling capacitor $C_{D6}$ includes a semiconductor layer 604 instead of the semiconductor layer 104. Instead of the semiconductor layer 104a, the semiconductor layer 104b, the semiconductor layer 104c, and the semiconductor layer 104d, the semiconductor layer 604 includes a semiconductor layer 604a, a semiconductor layer 604b, a semiconductor layer 604c, and a semiconductor layer 604d. The decoupling capacitor $C_{D6}$ includes a conductive layer 605 instead of the conductive layer 105. Instead of the conductive layer 105a, the conductive layer 105b, the conductive layer 105c, and the conductive layer 105d, the semiconductor layer 605 includes a conductive layer 605a, a conductive layer 605b, a conductive layer 605c, and a conductive layer 605d. A plurality of through via holes arranged in the Y direction are provided in the insulating layer 601, the region 602c of the semiconductor layer 602, the semiconductor layer 604c, and the conductive layer 605c.

The semiconductor substrate $S_6$ is basically configured similarly to the semiconductor substrate $S_5$ according to the fifth embodiment. However, for example, as shown in FIGS. 30 and 31, in the semiconductor substrate $S_6$ according to the sixth embodiment, impurity regions $S_{N+}$ are provided in a region corresponding to each through via hole $OP_{CD}$. The contact electrodes $CS_{VCCQ}$ are provided respectively in the impurity regions $S_{N+}$. The contact electrodes $CS_{VCCQ}$ are respectively connected to the voltage transfer lines $W_{VCCQ}$ via the wirings mx of the wiring layer MX. Accordingly, a sheet resistance of the N-well region $S_{NW}$ is effectively reduced since the voltage VCCQ is applied to the N-well region $S_{NW}$ at more locations. Therefore, a decrease in effective capacitance in a high frequency region can be prevented. At least some of the contact electrodes $CS_{VCCQ}$ are provided at positions overlapping the bonding pad electrode P when viewed from the Z direction.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
    a first semiconductor layer on a semiconductor substrate;
    a second semiconductor layer on the first semiconductor layer, the first semiconductor layer being between the second semiconductor layer and the semiconductor substrate in a first direction;
    a first conductive layer on the second semiconductor layer and contacting the second semiconductor layer;
    a third semiconductor layer spaced from the second semiconductor layer in a second direction intersecting the first direction and connected to the first semiconductor layer; and
    a second conductive layer spaced from the first conductive layer in the second direction and connected to the third semiconductor layer, wherein
    each of the first semiconductor layer, the second semiconductor layer, and the third semiconductor layer extends lengthwise in a third direction intersecting the first direction and the second direction.

2. The semiconductor device according to claim 1, further comprising:

a fourth semiconductor layer spaced from the third semiconductor layer in the second direction, the third semiconductor layer being between the second and fourth semiconductor layers in the second direction; and a third conductive layer spaced from the second conductive layer in the second direction and connected to the fourth semiconductor layer, the second conductive layer being between the first and third conductive layers, wherein the fourth semiconductor layer extends lengthwise in the third direction.

3. The semiconductor device according to claim 1, further comprising:

a fifth semiconductor layer connected to an end of the third semiconductor layer in the third direction, the fifth semiconductor layer extending lengthwise in the second direction; and a fourth conductive layer connected to an end of the second conductive layer in the third direction and extending lengthwise in the second direction.

4. The semiconductor device according to claim 1, further comprising:

a bonding pad, wherein each of the first semiconductor layer, the second semiconductor layer, and the third semiconductor layer includes a first part overlapped by the bonding pad, when viewed from the first direction, and a second part not overlapped by the bonding pad, when viewed from the first direction.

5. The semiconductor device according to claim 4, further comprising:

a plurality of first contact electrodes connected to the first conductive layer or the second conductive layer, wherein the first contact electrodes are at positions not overlapped by the bonding pad when viewed from the first direction.

6. The semiconductor device according to claim 1, further comprising:

an N-well containing an N-type impurity in the semiconductor substrate in a region below the first semiconductor layer in the first direction.

7. The semiconductor device according to claim 6, further comprising:

a bonding pad; and a second contact electrode connected to the N well, wherein the second contact electrode is at a position overlapped by the bonding pad when viewed from the first direction.

8. The semiconductor device according to claim 7, further comprising:

a bonding wire attached to a circular portion of the bonding pad.

9. A semiconductor device, comprising:

a semiconductor substrate including a plurality of shallow trench isolation (STI) features extending into the semiconductor substrate in a first direction and spaced from each other in a second direction, the STI features each extending lengthwise in a third direction orthogonal to the first and second directions and dividing the semiconductor substrate into a plurality of first regions of a first conductivity type;

a first insulation film on an upper surface of each first region, each first insulation film being between an adjacent pair of shallow trench insulation features in the second direction;

a first semiconductor layer on an upper surface of each first insulation film, each first semiconductor layer being between the adjacent pair of shallow trench insulation features in the second direction;

a second insulation film on an upper surface of each first semiconductor layer and an upper surface of the adjacent pair of shallow trench insulation features, the second insulation film including an opening exposing a portion of the upper surface of the first semiconductor layer;

a second semiconductor layer on the second insulation film, the second insulation film being between the second semiconductor layer and the first semiconductor layer in the first direction;

a first conductive layer on the second semiconductor layer and contacting the second semiconductor layer;

a third semiconductor layer spaced from the second semiconductor layer in the second direction and contacting the first semiconductor layer via the opening in the second insulation film; and a second conductive layer spaced from the first conductive layer in the second direction and contacting the third semiconductor layer, wherein each of the first semiconductor layer, the second semiconductor layer, and the third semiconductor layer extends lengthwise in the third direction.

10. The semiconductor device according to claim 9, further comprising:

a fourth semiconductor layer spaced from the third semiconductor layer in the second direction, the third semiconductor layer being between the second and fourth semiconductor layers in the second direction, the second insulating film being between the fourth semiconductor layer and the first semiconductor layer in the first direction; and a third conductive layer spaced from the second conductive layer in the second direction and contacting the fourth semiconductor layer, the second conductive layer being between first and third conductive layers in the second direction, wherein the fourth semiconductor layer extends lengthwise in the third direction.

11. The semiconductor device according to claim 9, further comprising:

a fifth semiconductor layer connected to an end of the third semiconductor layer in the third direction, the fifth semiconductor layer extending lengthwise in the second direction; and a fourth conductive layer connected to an end of the second conductive layer in the third direction and extending lengthwise in the second direction.

12. The semiconductor device according to claim 9, further comprising:

a bonding pad, wherein each of the first semiconductor layer, the second semiconductor layer, and the third semiconductor layer includes a first part overlapped by the bonding pad, when viewed from the first direction, and a second part not overlapped by the bonding pad, when viewed from the first direction.

13. The semiconductor device according to claim 12, further comprising:

a bonding wire attached to a circular portion of the bonding pad.

14. The semiconductor device according to claim 12, further comprising:

a plurality of first contact electrodes connected to the first conductive layer or the second conductive layer, wherein the first contact electrodes are at positions not overlapped by the bonding pad, when viewed from the first direction.

15. The semiconductor device according to claim 9, wherein the plurality of first regions is in a well of the first conductivity type, the well extending below and between the STI features to connect the plurality of first regions.

16. The semiconductor device according to claim 15, further comprising:

a bonding pad; and a second contact electrode connected to the well.

17. The semiconductor device according to claim 16, wherein the second contact electrode is at a position overlapped by the bonding pad when viewed from the first direction.

18. A semiconductor device including a plurality of decoupling capacitors, the semiconductor device comprising:

a bonding pad on a semiconductor substrate;

a first semiconductor layer on the semiconductor substrate and including a first portion below the bonding pad in a first direction and a second portion not below the bonding pad in the first direction;

a second semiconductor layer on the first portion of the first semiconductor layer, the first semiconductor layer being between the second semiconductor layer and the semiconductor substrate in the first direction;

a first conductive layer on the second semiconductor layer and contacting the second semiconductor layer;

a third semiconductor layer spaced from the second semiconductor layer in a second direction intersecting the first direction and connected to the first semiconductor layer, the third semiconductor layer including a first portion below the bonding pad and a second portion not below the bonding pad; and a second conductive layer spaced from the first conductive layer in the second direction and connected to the third semiconductor layer, wherein each of the first semiconductor layer, the second semiconductor layer, and the third semiconductor layer extends lengthwise in a third direction intersecting the first direction and the second direction beyond an outer edge of the bonding pad.

19. The semiconductor device according to claim 18, further comprising:

a fourth semiconductor layer spaced from the third semiconductor layer in the second direction, the third semiconductor layer being between the second and fourth semiconductor layers in the second direction; and a third conductive layer spaced from the second conductive layer in the second direction and connected to the fourth semiconductor layer, the second conductive layer being between the first and third conductive layers, wherein the fourth semiconductor layer extends lengthwise in the third direction beyond the outer edge of the bonding pad.

20. The semiconductor device according to claim 18, further comprising:

a fifth semiconductor layer connected to an end of the third semiconductor layer in the third direction, the fifth semiconductor layer extending lengthwise in the second direction; and a fourth conductive layer connected to an end of the second conductive layer in the third direction and extending lengthwise in the second direction, wherein the fifth semiconductor layer and the fourth conductive layer are not below the bonding pad.

* * * * *